United States Patent
Kim et al.

(10) Patent No.: US 7,446,049 B2
(45) Date of Patent: Nov. 4, 2008

(54) METHOD FOR FABRICATING SEMICONDUCTOR DEVICE USING AMORPHOUS CARBON LAYER AS SACRIFICIAL HARD MASK

(75) Inventors: Kwang-Ok Kim, Ichon-shi (KR); Yun-Seok Cho, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 83 days.

(21) Appl. No.: 11/149,326

(22) Filed: Jun. 10, 2005

(65) Prior Publication Data

US 2006/0024945 A1   Feb. 2, 2006

(30) Foreign Application Priority Data

Jul. 29, 2004   (KR) .................. 10-2004-0059535

(51) Int. Cl.
*H01L 21/311* (2006.01)
(52) U.S. Cl. .................. 438/706; 438/725; 438/710; 438/717; 438/157; 438/283; 438/481
(58) Field of Classification Search .................. 438/706
See application file for complete search history.

(56) References Cited

U.S. PATENT DOCUMENTS

| | | | | |
|---|---|---|---|---|
| 6,645,797 | B1 * | 11/2003 | Buynoski et al. | 438/157 |
| 7,037,850 | B2 * | 5/2006 | Lee et al. | 438/725 |
| 2004/0079726 | A1 * | 4/2004 | Tabery et al. | 216/58 |
| 2005/0112509 | A1 * | 5/2005 | Fairbaim et al. | 430/322 |

FOREIGN PATENT DOCUMENTS

| | | | |
|---|---|---|---|
| EP | 0531232 | * | 8/1992 |
| JP | 05-211119 | | 8/1993 |
| KR | 1994-0022189 | | 10/1994 |
| KR | 1997-0016751 | | 4/1997 |
| KR | 1998-0072825 | | 11/1998 |
| KR | 10-188508 | | 6/1999 |
| KR | 1999-0057333 | | 7/1999 |
| KR | 10-2005-0058916 A | | 6/2005 |

OTHER PUBLICATIONS

S. Wolf, Silicon Processing for the VLSI Era, vol. 1, Lattic Press (1986) pp. 407-408.*
Notice of Preliminary Rejection from the Korean Intellectual Property Office, dated Aug. 30, 2006, in counterpart Korean Patent Application No. 2004-59535.

* cited by examiner

*Primary Examiner*—Lan Vinh
*Assistant Examiner*—Maki Angadi
(74) *Attorney, Agent, or Firm*—Finnegan, Henderson, Farabow, Garrett, & Dunner L.L.P.

(57) ABSTRACT

Disclosed is a method for fabricating a semiconductor device by using an amorphous carbon layer as a sacrificial hard mask. The method includes the steps of: forming an amorphous carbon layer on an etch target layer; forming a photoresist pattern on the amorphous carbon layer; etching the amorphous carbon layer by using the photoresist pattern to form a sacrificial hard mask; and etching the etch target layer by using the sacrificial hard mask to form a predetermined pattern.

23 Claims, 24 Drawing Sheets

M1

METHOD FOR FABRICATING SEMICONDUCTOR DEVICE USING AMORPHOUS CARBON LAYER AS SACRIFICIAL HARD MASK

FIELD OF THE INVENTION

The present invention relates to a method for fabricating a semiconductor device; and, more particularly, to a method for forming a pattern in a semiconductor device through an advanced photolithography process compared with a typical ArF or $F_2$ photolithography.

DESCRIPTION OF RELATED ARTS

Photolithography is one advanced fine manufacturing process that has made a contribution to a current astonishing progression in semiconductor devices. Especially, an improvement on resolution of the photolithography is a critical factor for advancing an integration scale of semiconductor devices.

As known, photolithography includes a process for forming a photoresist pattern and a process for forming desired patterns like line patterns, for instance, contact holes and gate structures, by etching an etch target with use of the photoresist pattern as an etch mask. Herein, the photoresist pattern is formed through sequential processes including a process for forming a photoresist layer on the etch target, a photo-exposure process for selectively exposing the photoresist layer with use of a photo-exposure mask and a developing process for removing a photo-exposed portion or non-photo-exposed portion of the photoresist layer by using a predetermined chemical solution.

Meanwhile, a critical dimension (CD) of the pattern obtained through the photolithography depends on use of a light source with a certain wavelength at the photo-exposure process because a width of the photoresist pattern formed by the photo-exposure process determines a CD of an actual pattern.

A photo-exposure apparatus for the photolithography has been progressed from an initially used stepper compatible with a light source with a wavelength of 636 nm, i.e., a g-line, and a light source of 365 nm, i.e., an i-line, to a stepper using deep ultra-violet (DUV) with a wavelength of 248 nm, which is a KrF excimer laser beam, and a scanner type photo-exposure apparatus. Especially, the photolithography using DUV of 248 nm is applied to develop semiconductor devices with the size of 0.18 μm. However, this photolithography is disadvantageous in an incidence of a time delay at an initial stage of the photolithography and dependent on properties of an employed material. In order to develop semiconductor devices with the size of 0.15 μm, it is essential to develop a new photolithography method using DUV with a wavelength of 193 nm, i.e., an ArF excimer laser beam or a wavelength of 157 nm, i.e., a $F_2$ laser beam. Even if various photolithography techniques are combined to improve resolution of the above mentioned DUV photolithography, it is very difficult to obtain a pattern below the size of 0.1 μm. Therefore, there has vigorously made an attempt to discover a new light source for the photolithography process.

Such photolithography using a light source of ArF and photolithography using a light source of $F_2$ laser require using a specific type of photoresist. Although ArF and $F_2$ photoresists are chemically amplified photoresists as like a KrF photoresist, it is necessary to fundamentally modify a material used for forming the ArF or $F_2$ photoresist. Especially, it is difficult to develop a material for the ArF photoresist because it is not allowed to use a benzene ring which is used for the KrF and i-line photoresist to secure a tolerance to a dry etching process.

However, when the benzene ring is used for the ArF photoresist, absorption of the benzene ring is large at a wavelength of 193 nm of the ArF laser, resulting in a decrease in transparency which further causes a problem in that a bottom portion of the photoresist is not possibly photo-exposed. Therefore, a current study has been focused to develop a photoresist material capable of securing a tolerance to a dry etching process without having the benzene ring, of having good adhesion and of being developed by using 2.38% tetramethyl ammonium hydroxide (TMAH). Most commonly used photoresist materials are based on a cycloolefin-maleic anhydride (COMA) or acrylate polymer or the combination of these two polymers. However, these mentioned polymer-based photoresist materials have a benzene ring structure.

FIG. 1A is a top view showing a conventional line-type mask pattern using a KrF photolithography process. FIG. 1B is a top view showing a conventional line-type mask pattern using an ArF photolithography process.

As shown in FIG. 1A, when the KrF photolithography is used, the line-type mask pattern M1 is rarely deformed. On the other hand, when the ArF photolithography is used, as shown in FIG. 1B, the line-type mask pattern M2 is deformed. One example of the deformation is striation.

FIGS. 2A and 2B are top views showing patterns resulted from an etching process using the line-type mask patterns M1 and M2 shown in FIGS. 1A and 1B, respectively.

As shown in FIG. 2A, when the KrF photolithography process is applied, the pattern P1 is formed without being deformed in a shape identical to that of the line-type mask pattern M1. On the other hand, in case of the ArF photolithography, the pattern P2 shown in FIG. 2B is severely deformed because the line-type mask pattern M2 based on photoresist is clustered or deformed during an etching process. Also, because the photoresist has weak tolerance to the etching process, the line-type mask pattern M2 is leaned to one direction, causing the deformation of the pattern P2.

Therefore, when the ArF photolithography process is applied to form an intended pattern, a method for using a sacrificial hard mask formed in a single layer of tungsten or nitride or in a stack structure of tungsten and nitride is suggested to minimize the pattern deformation.

FIGS. 3A to 3D are cross-sectional views illustrating a conventional method for forming a line-type pattern in a semiconductor device by employing a device using one of $F_2$ laser and ArF. Hereinafter, among various line-type pattern formation processes, a bit line formation process will be described.

Referring to FIG. 3A, a conductive layer 31A is formed as an etch target layer on a substrate 30 provided with various device elements, and an insulation layer 32A for forming a hard mask is formed on the conductive layer 31A. Herein, the insulation layer 32A is formed by using materials typically applied as a hard mask material because of an insulation characteristic and specific selectivity with respect to the conductive layer 31A. Such materials are a nitride-based film like $Si_3N_4$ or SiON and an oxide-based thin film like $SiO_2$.

Afterwards, a sacrificial hard mask layer 33A is formed on the insulation layer 32A for the purpose of preventing pattern deformation caused by losses of the insulation layer 32A during an etching process. Herein, the sacrificial hard mask layer 33A is formed by using a material such as polysilicon, Al, W, $WSi_x$, where x representing an atomic ratio of silicon ranges from 1 to 2, WN, Ti, TiN, $TiSi_x$, where x representing an atomic ratio of silicon ranges from 1 to 2, TiAlN, TiSiN, Pt, Ir, $IrO_2$, Ru, $RuO_2$, Ag, Au, Co, TaN, CrN, CoN, MoN, $MoSi_x$, where x representing an atomic ratio ranges from 1 to 2, $Al_2O_3$, AlN, $PtSi_x$, where x representing an atomic ratio ranges from 1 to 2 or $CrSi_x$, where x representing an atomic ratio ranges from 1 to 2.

Next, the sacrificial hard mask layer 33A is overlaid with an anti-reflective coating (ARC) layer 34A for preventing formation of an undesired pattern due to scattering reflection caused by a high index of reflection of the sacrificial hard mask 33A during a photo-exposure process for forming a pattern and for improving adhesiveness between the sacrificial hard mask 33A and a photoresist layer, which will be subsequently formed. Herein, the ARC layer 34A is formed by using a material based on an organic family having a similar etch characteristic to the photoresist layer.

Then, the aforementioned photoresist layer for use in ArF or $F_2$ laser is coated with a predetermined thickness on the ARC layer 34A by employing a spin coating method. The photoresist layer is then selectively photo-exposed by using one of ArF and $F_2$ laser and a predetermined reticle (not shown) for defining a width of a gate structure. A developing process is applied to make those photo-exposed or non-photo-exposed portions remain and then, a cleaning process is performed to remove etch remnants, thereby forming a photoresist pattern 35A.

Referring to FIG. 3B, the ARC layer 34A shown in FIG. 3A is selectively etched by using the photoresist pattern 35A shown in FIG. 3A as an etch mask, thereby obtaining a patterned ARC layer 34B. At this time, a remaining portion of the photoresist pattern 35A after the selective etching process is denoted with a reference numeral 35B. Thereafter, the sacrificial hard mask layer 33A shown in FIG. 3A is etched by using the remaining photoresist pattern 35B as an etch mask, thereby obtaining a sacrificial hard mask 33B.

Referring to FIG. 3C, with using at least the sacrificial hard masks 33B as an etch mask, the insulation layer 32A shown in FIG. 3B is etched to form a hard mask 32B. At this time, the remaining photoresist pattern 35B and the patterned ARC layer 34B are almost removed or remain partially and thus, the remaining photoresist pattern 35B and the patterned ARC layer 34B can be still used as an etch mask unless a separate photoresist stripping process is employed. Also, it should be noted that a reference numeral 33C denotes a remaining sacrificial hard mask after this etching process and, during this etching process for forming the hard mask 32B, the remaining photoresist pattern 35B and the patterned ARC layer 34B are naturally removed.

Referring to FIG. 3D, the conductive layer 31A shown in FIG. 3C is selectively etched by using the remaining sacrificial hard mask 33C and the hard mask 32B shown in FIG. 3C as an etch mask to form a conductive pattern 31B, more particularly, bit lines. At this time, to eliminate an additional etching process for removing the remaining sacrificial hard mask 33C, the conductive layer 31A is made of the same material used for forming the sacrificial hard mask layer 33A, or even if the conductive layer 31A and the sacrificial hard mask layer 33A are made of different materials, the thickness and etch recipe are specifically controlled to remove the remaining sacrificial hard mask 33C during etching the conductive layer 31A. However, during this etching process, a remaining portion 32C of the hard mask 32B may be prone to an incidence of pattern deformation 36, for instance, line edge roughness (LER) or striation.

FIG. 4 is a top view showing contact holes formed through a conventional ArF photolithography process. As shown, in the conventional ArF photolithography, the contact holes are deformed as denoted with 'D'.

FIG. 5 is a cross-sectional view showing contact hole pattern structure obtained through using a photoresist pattern as an etch mask.

As shown, a photoresist pattern 54 is used as a hard mask during an etching process for forming 0.2 µm of the contact holes by etching an insulation layer 52 made of tetraethylorthosilicate (TEOS) formed on a substrate 50. Especially, the etching process is carried out by using 42 sccm of $C_4F_6$ and 27 sccm of $O_2$ and 500 sccm of Ar under a pressure of 40 mtorr along with supplied power of 1800 W and magnetic flux density of 40 G. Under such etch recipe, an etch selectivity ratio of the insulation layer 52 to the photoresist pattern 54 is 12 to 1. However, using the photoresist pattern 54 as an etch mask results in an incidence of pattern deformation.

Meanwhile, even if the photoresist pattern is normally shaped, the targeted pattern may be prone to incidences of line edge roughness (LER) as shown in FIG. 3D and striation during the etching process. Furthermore, even if the sacrificial hard mask is applied, it may be difficult to overcome limitation in etch selectivity.

SUMMARY OF THE INVENTION

It is, therefore, an object of the present invention to provide a method for fabricating a semiconductor device capable of minimizing pattern deformation by increasing etch selectivity of a sacrificial hard mask.

In accordance with an aspect of the present invention, there is provided a method for fabricating a semiconductor device, including the steps of: forming an amorphous carbon layer on an etch target layer; forming a photoresist pattern on the amorphous carbon layer; etching the amorphous carbon layer by using the photoresist pattern to form a sacrificial hard mask; and etching the etch target layer by using the sacrificial hard mask to form a predetermined pattern.

In accordance with another aspect of the present invention, there is provided a method for fabricating a semiconductor device, including the steps of: forming an amorphous carbon layer on an etch target layer; forming a sacrificial hard mask layer on the amorphous carbon layer; forming a photoresist pattern on the sacrificial hard mask layer; etching the sacrificial hard mask layer by using the photoresist pattern to forming a first sacrificial hard mask; etching the amorphous carbon layer by using the first sacrificial hard mask to form a second sacrificial hard mask; and etching the etch target layer by using the second sacrificial hard mask to form a predetermined pattern.

In accordance with still another aspect of the present invention, there is provided a method for fabricating a semiconductor device, including the steps of: forming an amorphous carbon layer on an etch target layer; forming an anti-reflective coating layer on the amorphous carbon layer; forming a photoresist pattern on the anti-reflective coating layer; etching the anti-reflective coating layer by using the photoresist pattern; etching the amorphous carbon layer by using the photoresist pattern to form a sacrificial hard mask; and etching the etch target layer by using the sacrificial hard mask to form a predetermined pattern.

In accordance with still another aspect of the present invention, there is provided a method for fabricating a semiconductor device, including the steps of: forming an amorphous carbon layer on an etch target layer; forming a sacrificial hard mask layer on the amorphous carbon layer; forming an anti-reflective coating layer on the sacrificial hard mask layer; forming a photoresist pattern on the anti-reflective coating layer; etching the anti-reflective coating layer by using the photoresist pattern; etching the sacrificial hard mask layer by using the photoresist pattern to form a first sacrificial hard mask; etching the amorphous carbon layer by using the first sacrificial hard mask to form a second sacrificial hard mask; and etching the etch target layer by using the second sacrificial hard mask to form a predetermined pattern.

In accordance with still another aspect of the present invention, there is provided a method for fabricating a semiconductor device, including the steps of: forming an insulation layer on an etch target layer; forming an amorphous carbon layer on the insulation layer; forming an anti-reflective coating layer on the amorphous carbon layer; forming a photoresist pattern on the anti-reflective coating layer; etching anti-reflective coating layer by using the photoresist pattern; etching the amorphous carbon layer by using the photoresist pattern to form a sacrificial hard mask; etching the insulation layer by using the sacrificial hard mask to form a hard mask; and etching the etch target layer by using the sacrificial hard mask and the hard mask to form a predetermined pattern.

In accordance with further aspect of the present invention, there is provided a method for fabricating a semiconductor device, including the steps of: forming an insulation layer on an etch target layer; forming an amorphous carbon layer on the insulation layer; forming a sacrificial hard mask layer on the amorphous carbon layer; forming an anti-reflective coating layer on the sacrificial hard mask layer; forming a photoresist pattern on the anti-reflective coating layer; etching anti-reflective coating layer by using the photoresist pattern; etching the sacrificial hard mask layer by using the photoresist pattern to form a first sacrificial hard mask; etching the amorphous carbon layer by using the first sacrificial hard mask to form a second sacrificial hard mask; etching the insulation layer by using the second sacrificial hard mask to form a hard mask; and etching the etch target layer by using the second sacrificial hard mask and the hard mask to form a predetermined pattern.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device using an amorphous carbon layer as a sacrificial hard mask in accordance with a preferred embodiment of the present invention will be described in detail with reference to the accompanying drawings.

Figure 6A:
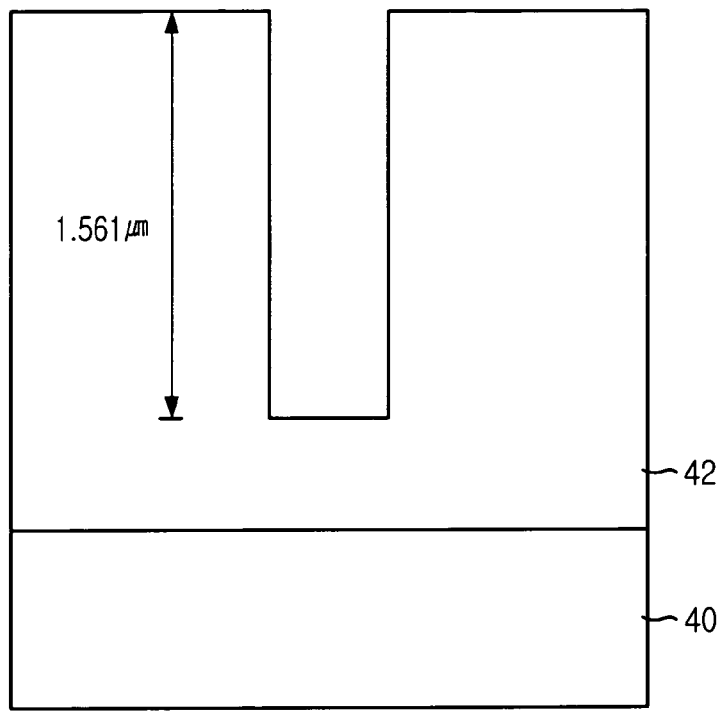
FIGS. 6A and 6B are cross-sectional views showing contact holes formed through using an amorphous carbon layer as a hard mask in accordance with the present invention.
Figure 6B:
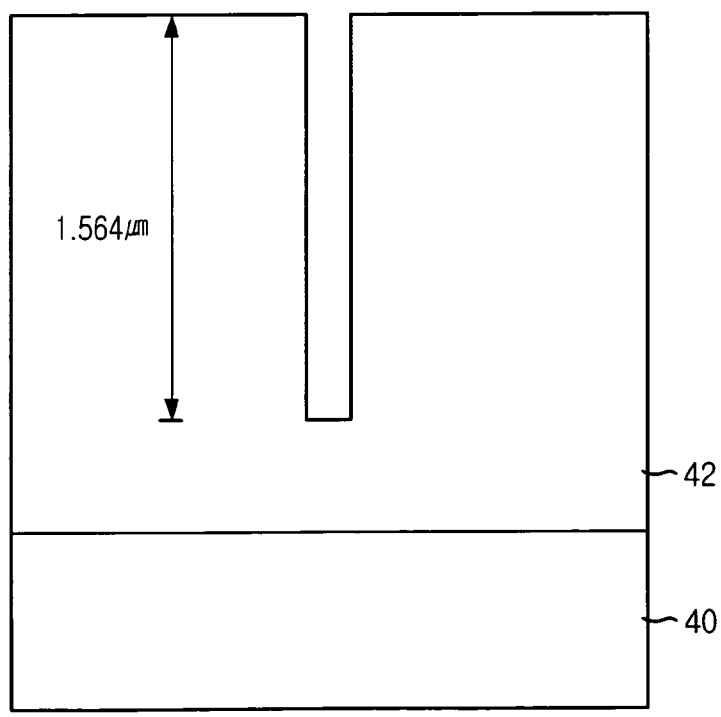

FIGS. 6A and 6B are cross-sectional views showing contact holes formed through using an amorphous carbon layer as a hard mask in accordance with the present invention. Especially, FIG. 6A shows a contact hole with the size of approximately 1.561 μm, while FIG. 6B shows a contact hole with the size of approximately 1.564 μm. Herein, in FIGS. 6A and 6B, the same reference numerals are used for the same configuration elements.

As shown in FIGS. 6A and 6B, the contact holes are formed without being deformed, and in both cases, an inter-layer insulation layer 42 formed on a substrate 40 is formed by using tetraethylorthosilicate (TEOS).

Figure 7:
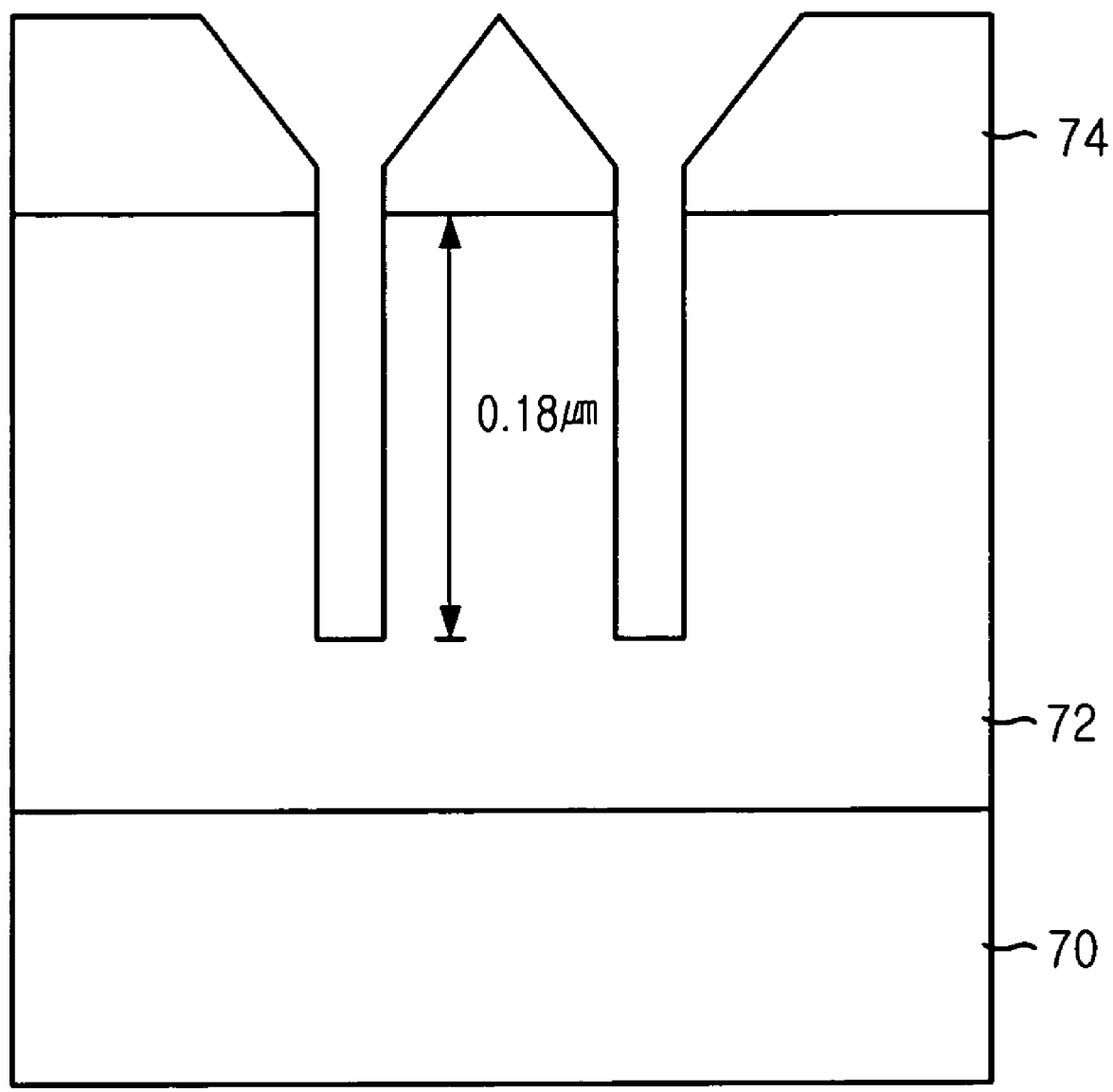
FIG. 7 is a cross-sectional view showing contact holes obtained through using an amorphous carbon layer as a sacrificial hard mask in accordance with the present invention.

FIG. 7 is a cross-sectional view showing contact holes obtained through using an amorphous carbon layer as a sacrificial hard mask in accordance with the present invention.

Figure 5:
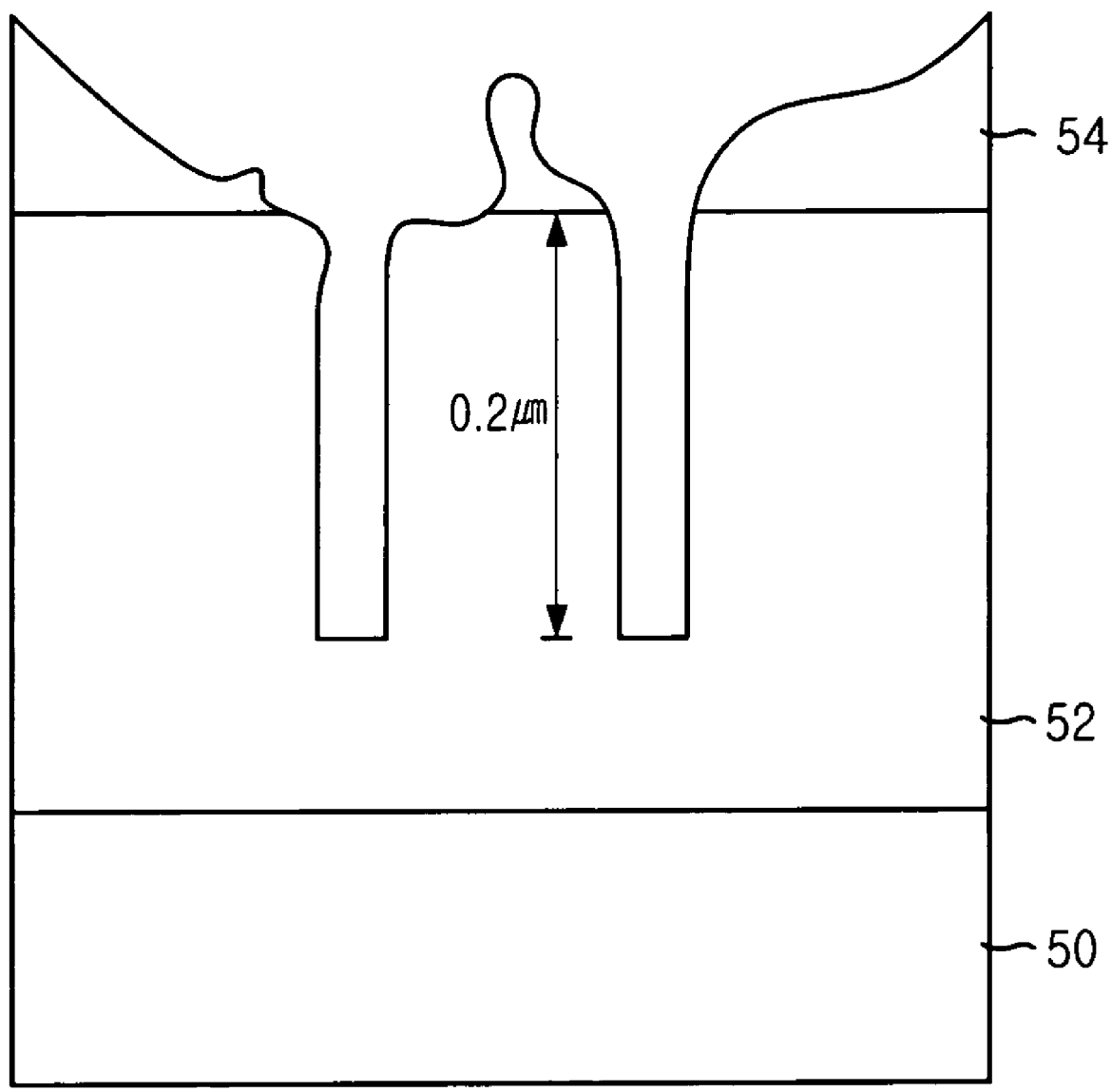
FIG. 5 is a cross-sectional view showing contact holes formed through using a conventional photoresist pattern as an etch mask.

Herein, the contact holes have the size of approximately 0.18 μm, and are formed by etching an inter-layer insulation layer 72 made of TEOS and formed on a substrate 70 by using an amorphous carbon layer 74 as a sacrificial hard mask. At this time, the etching process is carried out by using approximately 43 sccm of $C_4F_6$, approximately 28 sccm of $O_2$, approximately 15 sccm of $CHF_3$ and approximately 500 sccm of Ar under a pressure of approximately 40 mtorr along with supplied power of approximately 1800 W and magnetic flux density of approximately 40 G. Through this etching process, an etch selectivity ratio of the inter-layer insulation layer 72 to the amorphous carbon layer 74 is approximately 26 to approximately 1. Compared with the generally used photoresist pattern as shown in FIG. 5, the use of the amorphous carbon layer 74 provides an effect of forming the contact holes without an incidence of deformation.

FIGS. 8A to 8F are cross-sectional views illustrating a method for forming a pattern in a semiconductor device through performing a $F_2$ or ArF photolithography in accordance with a first embodiment of the present invention.

Among various types of line-type patterns, the case of forming bit lines is exemplified in the first embodiment of the present invention. However, this embodied line-type pattern formation is also applicable to other various types of patterns for forming gate structures, storage node contacts, metal lines and so on.

Also, in addition to the line-type, an island type and a donut-shaped type as like the shape of a storage node contact can also be applicable. Furthermore, although the above line-type pattern is based on a conductive layer, an insulation layer can also be used. Additionally, the line-type pattern illustrated in the first embodiment is a positive pattern.

Figure 8A:
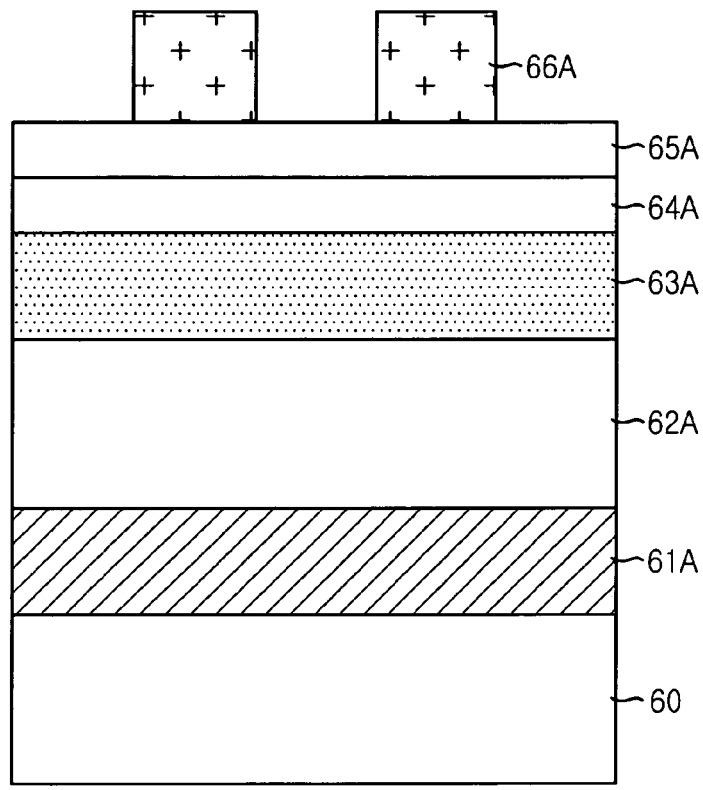
FIGS. 8A to 8F are cross-sectional views illustrating a method for forming a pattern in a semiconductor device through performing a $F_2$ or ArF photolithography process in accordance with a first embodiment of the present invention.

Referring to FIG. 8A, a conductive layer 61A is formed as an etch target layer on a substrate 60 provided with various device elements, and an insulation layer 62A for forming a hard mask is formed on the conductive layer 61A by employing one of a nitride-based thin film such as $Si_3N_4$ or SiON and an oxide-based thin film such as $SiO_2$ both being used as a hard mask material because of specific selectivity with respect to the conductive layer 61A while maintaining an insulation property. Then, an amorphous carbon layer 63A for forming a sacrificial hard mask is formed on the insulation layer 62A to prevent an incidence of pattern deformation caused by a loss of the insulation layer 62A during an etching process. Afterwards, a sacrificial hard mask layer 64A is formed on the amorphous carbon layer 63A.

Herein, the amorphous carbon layer 63A includes a composition of carbon similar to that of photoresist and thus, using a photoresist pattern as an etch mask decreases etching efficiency. Therefore, it is preferable to use an additional sacrificial hard mask between the amorphous carbon layer 63A and the photoresist pattern.

Also, the sacrificial hard mask layer 64A includes a material selected from a group consisting of polysilicon, Al, W, $WSi_x$, WN, Ti, TiN, $TiSi_x$, TiAlN, TiSiN, Pt, Ir, $IrO_2$, Ru, $RuO_2$, Ag, Au, Co, TaN, CrN, CoN, MoN, $MoSi_x$, $Al_2O_3$, AlN, $PtSi_x$, and $CrSi_x$. Herein, 'x' represents an atomic ratio of silicon ranging from approximately 1 to approximately 2.

If a structure of a tungsten layer/a nitride or oxide layer/an amorphous carbon layer is applied as a sacrificial hard mask, a thickness of the tungsten layer is set to be less than approximately 300 Å, so that the tungsten layer is not affected by an etch selectivity ratio of a photoresist pattern. Even if a pattern formation process is carried out under high resolution, in case of an ArF photolithography process, a thickness of a photoresist layer is set to be approximately 1,000 Å. That is, approximately 300 Å of the tungsten layer will be etched without difficulty when the photoresist pattern of which thickness is approximately 1,000 Å is used. Meanwhile, if the nitride or oxide layer formed beneath the tungsten layer is formed in a thickness ranging from approximately 300 Å to approximately 600 Å, it is possible to etch approximately 300 Å of the tungsten layer. After sequentially etching the tungsten layer and the nitride or oxide layer through the above-described processes, the amorphous carbon layer is etched. At this time, if $N_2$ gas or $O_2$ gas is used for etching the amorphous carbon layer, an etch selectivity ratio of the nitride or oxide layer to the amorphous carbon layer is above approximately 20 to approximately 1.

This etch selectivity ratio indicates that approximately 6,000 Å to approximately 12,000 Å of the amorphous carbon layer can be etched by using approximately 300 Å to approximately 600 Å of the nitride or oxide layer. The amorphous carbon layer with the minimum thickness of approximately 6,000 Å is capable of etching sufficiently the nitride layer of which thickness is greater than approximately 3,000 Å and then a conductive layer disposed beneath the nitride layer. Even after the sequential etching, a reaming thickness of the amorphous carbon layer is greater than approximately 2,000 Å.

Herein, the substrate 60 includes an insulation structure and a conductive structure. As like the first embodiment, if the conductive layer 61A is for forming a bit line or a metal line, a diffusion barrier layer such like TiN/TiN, impurity junctions such like sources/drains, an inter-layer insulation layer, or a plug made of polysilicon or tungsten will be formed between the conductive layer 61A and the substrate 60. Also, if the conductive layer 61A is for forming a gate electrode, a gate insulation layer (not shown) will be formed between the conductive layer 61A and the substrate 60.

Next, an anti-reflective coating (ARC) layer 65A is formed on the sacrificial hard mask layer 64A to prevent formation of an undesired pattern due to scattering reflection caused by a high index of reflection of the amorphous carbon layer 63A during a photo-exposure process for forming an intended pattern structure and to improve adhesion between the sacrificial hard mask layer 64A and the photoresist pattern, which will be formed subsequently. At this time, the Arc layer 65A can be formed by using an organic material having a similar etch characteristic to that of photoresist or an inorganic material such as SiON.

Afterwards, although not illustrated, a photoresist layer for use in a $F_2$ or ArF photolithography process is formed on the ARC layer 65A by employing a spin coating method until an intended thickness of the photoresist layer is obtained. At this time, the photoresist layer is made of cycloolefin-maleic anhydride (COMA) or acrylate. Thereafter, a portion of the photoresist layer is selectively photo-exposed through the use of a photo-exposure device for $F_2$ laser or ArF and a predetermined reticle (not shown) for defining a width of a bit line structure. A developing process is then performed to make a photo-exposed portion or non-photo-exposed portion of the photoresist layer remain. Subsequent to the developing process, a cleaning process is performed to remove etch remnants, thereby completing formation of a photoresist pattern 66A.

Figure 8B:
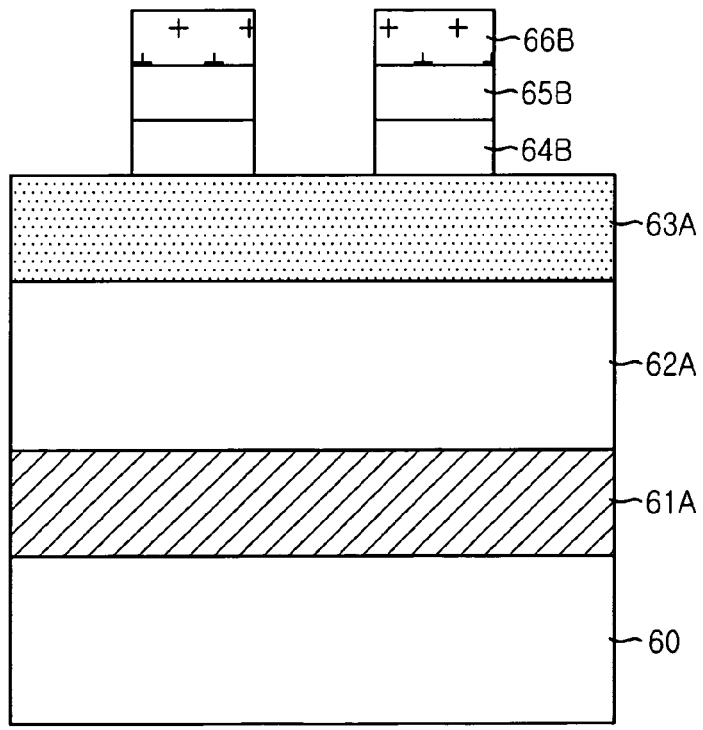

Referring to FIG. 8B, the ARC layer 65A shown in FIG. 8A is selectively etched by using the photoresist pattern 66A as an etch mask, thereby forming a patterned ARC layer 65B. At this time, the above etching process is performed by using preferably a plasma containing a chorine-based gas such as Cl$_2$, BCl$_3$, CCl$_4$ or HCl to minimize losses of the photoresist pattern 66A. In case that a carbon fluoride (CF)-based gas is used, the etching process proceeds by using preferably a plasma containing such a gas that gives a low ratio of carbon to fluorine. Such gas is selected from a group consisting of CF$_4$, C$_2$F$_2$, CHF$_3$ and CH$_2$F$_2$. The above mentioned gas is selected to minimize generation of polymers during the etching process since it is necessary to control a CD during the etching of the ARC layer 65A shown in FIG. 8A. Also, it should be noted that a reference denotation 66B denotes a remaining photoresist pattern after the above etching process.

Afterwards, the sacrificial hard mask layer 64A shown in FIG. 8A is etched by using the remaining photoresist pattern 66B as an etch mask to form a first sacrificial hard mask 64B.

Hereinafter, the etching of the sacrificial hard mask layer 64A will be described in more detail. If the sacrificial hard mask layer 64A includes a tungsten-based layer formed by using a material such as W, WSi$_x$ or WN, a plasma containing a mixed gas of SF$_6$ gas and N$_2$ gas is used for this etching process. At this time, the mixing ratio preferably ranges from approximately 0.10 to approximately 0.60.

If the sacrificial hard mask layer 64A includes a polysiliocn layer or a titanium-based layer formed by using a material selected from a group consisting of Ti, TiN, TiSi$_x$, TiAlN, and TiSiN, a gas based on a family of chorine, especially, chlorine (Cl$_2$) gas is used as a main etch gas. In addition to the main etch gas, adequate amounts of O$_2$ gas and CF gas are added to control an etch profile.

If the sacrificial hard mask layer 64A includes a noble metal such as Pt, Ir, Ru or oxide thereof, a plasma containing a chlorine-based gas or a fluorine-based gas is used. At this time, high ion energy is required to control the etch profile, the etching process is carried out preferably by maintaining a condition of low pressure and high bias power.

Figure 8C:
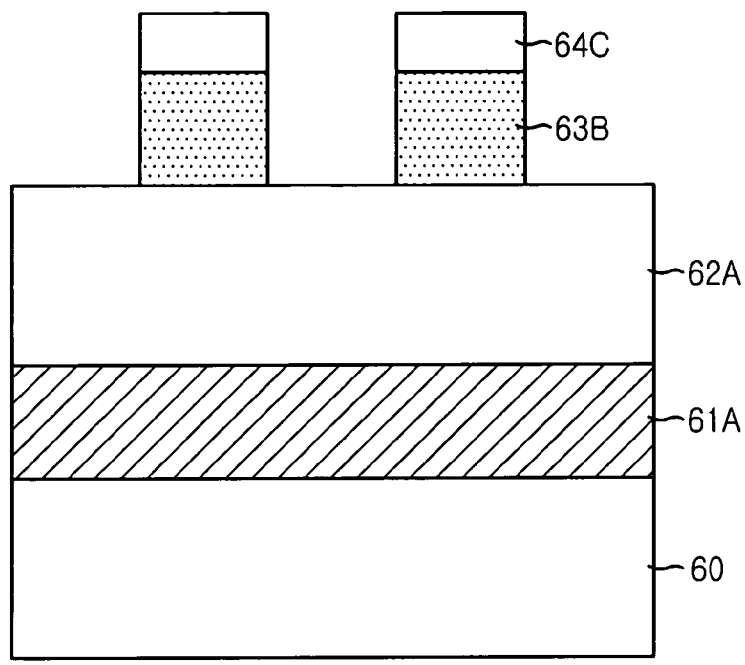

Referring to FIG. 8C, with using at least the first sacrificial hard mask 64B as an etch mask, the amorphous carbon layer 63A shown in FIG. 8B is etched by using N$_2$ gas or O$_2$ gas, thereby forming a second sacrificial hard mask 63B. At this time, the remaining photoresist pattern 66B and the patterned ARC layer 65B are almost removed or remain partially and thus, the remaining photoresist pattern 66B and the patterned ARC layer 65B can still act as an etch mask if not being removed through a separate photoresist stripping process. Also, since an etch selectivity ratio between the first sacrificial hard mask 64B and the amorphous carbon layer 63A is high, it is possible to secure a sufficient thickness of the second sacrificial hard mask 63B. Herein, a reference numeral 64C denotes a remaining first sacrificial hard mask after this etching process.

Figure 8D:
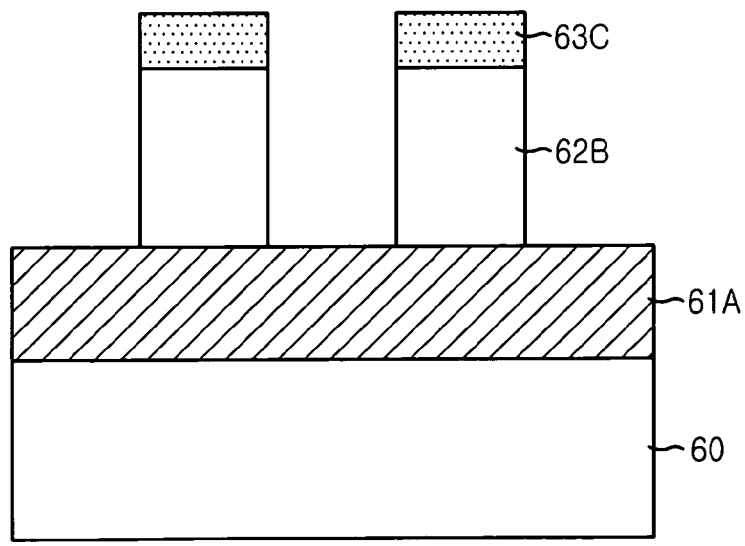

Referring to FIG. 8D, the insulation layer 62A shown in FIG. 8C is selectively etched by employing the second sacrificial hard mask 63B as an etch mask to form a hard mask 62B. At this time, the etching utilizes a CF-based gas, which is used for etching a typical nitride-based or oxide-based material, as a main etch gas. Also, since the second sacrificial hard mask 63B can be secured with a sufficient thickness even during this etching process, there is not an incidence of pattern deformation in the course of forming the hard mask 62B. A reference denotation 63C represents a first remaining second hard mask after the etching process.

Figure 8E:
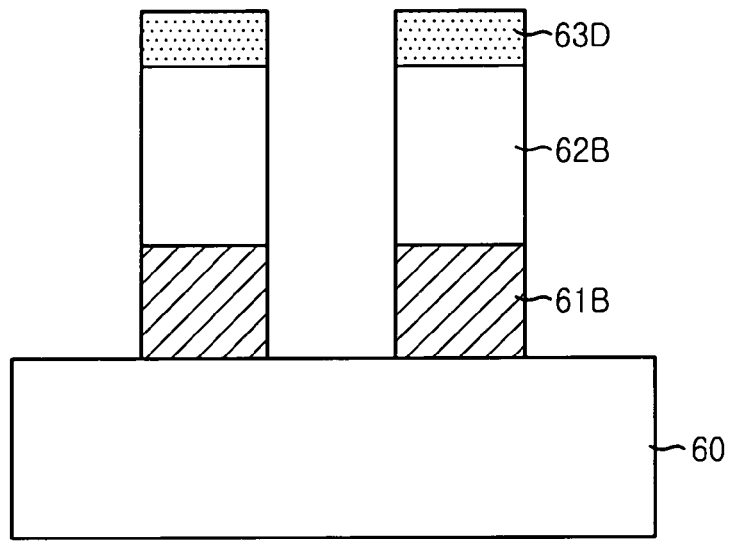

Referring to FIG. 8E, the conductive layer 61A shown in FIG. 8D is selectively etched by using the first remaining second sacrificial hard mask 63C and the hard mask 62B as an etch mask to thereby form a conductive pattern 61B, which is a bit line. For this etching process for forming the conductive pattern 61B, a quantity of the selected etch gas and applied power are adjusted depending on a type of a material used for forming the conductive layer 61A. Herein, a reference denotation 63D denotes a second remaining second sacrificial hard mask that still remains after the above etching process.

Figure 8F:
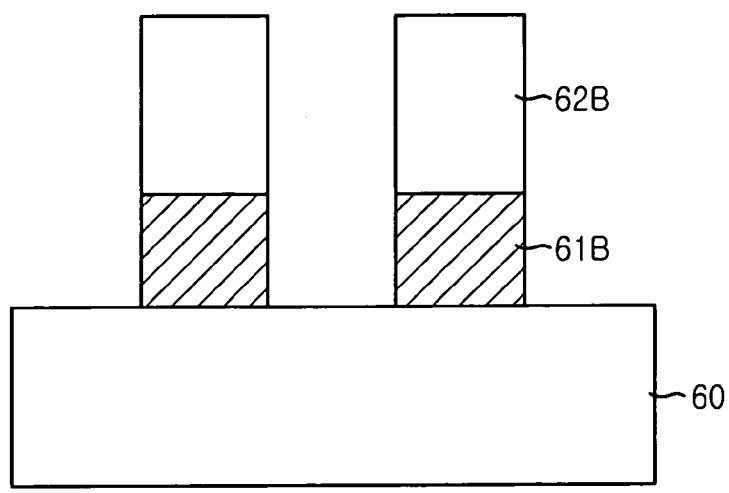

Referring to FIG. 8F, the second remaining second sacrificial hard mask 63D is removed. Through using oxygen plasma, the second remaining second sacrificial hard mask 63D can be removed without difficulty since the second remaining second sacrificial hard mask 63D is an amorphous carbon layer.

Figure 9:
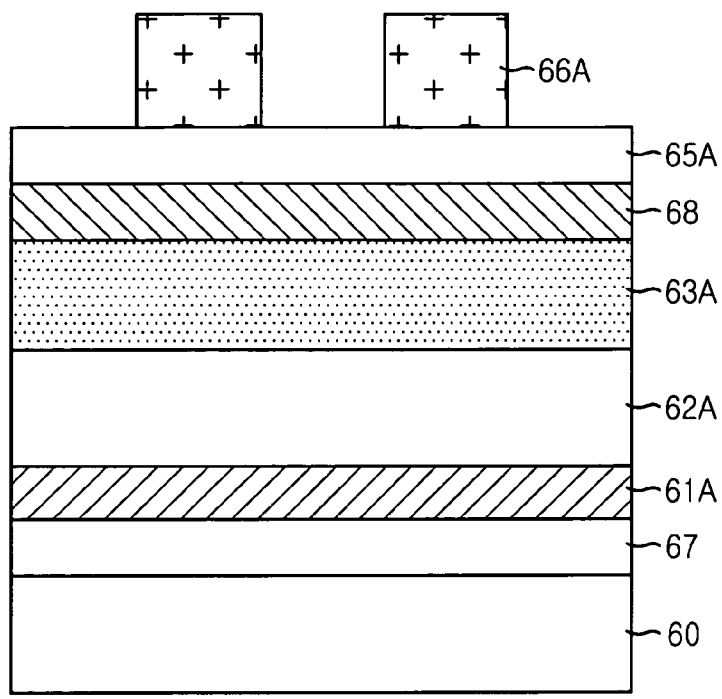
FIG. 9 is a cross-sectional view showing a stack structure for forming a conductive pattern by using an amorphous carbon layer as a sacrificial hard mask in accordance with a second embodiment of the present invention.

FIG. 9 is a cross-sectional view showing a stack structure for forming a conductive pattern by using an amorphous carbon layer as a sacrificial hard mask in accordance with a second embodiment of the present invention. Herein, the same reference numerals are used for those substantially identical configuration elements described in the first embodiment.

As shown, a first conductive layer 67 made of TiN or polysilicon and a second conductive layer 61A made of tungsten are sequentially formed on a substrate 60. Then, an insulation layer 62A for use in a hard mask is formed on the second conductive layer 61A. The insulation layer 62A, the second conductive layer 61A and the first conductive layer 67 are patterned to be formed as a bit line or the like. On top of the insulation layer 62A, an amorphous carbon layer 63A for use in a sacrificial hard mask is formed, being overlaid with a dual sacrificial hard mask layer 68 obtained through sequentially stacking a nitride layer and a tungsten layer. An anti-reflective coating layer 65A and a photoresist pattern 66A are formed on the dual sacrificial hard mask layer 68.

The tungsten layer of the dual sacrificial hard mask layer 68 has a thickness ranging from approximately 200 Å to approximately 1,000 Å. Because of this thickness, it is possible to perform an etching process even though the photoresist pattern 66A is thinly formed. Since the tungsten layer of the dual sacrificial hard mask layer 68 is sufficient to function as an etch mask, the nitride layer disposed beneath the tungsten layer is formed in a thickness that allows an etching of the amorphous carbon layer 63A. That is, the thickness of the nitride layer is greater than approximately 200 Å. At this time, the nitride layer can be substituted with a material selected from a group consisting of oxide, nitride, oxynitride and a combination thereof. The amorphous carbon layer 63A is formed in a thickness greater than at least approximately 1,000 Å, typically, greater than approximately 2,000 Å for the purpose of securing an intended level of etch selectivity with respect to the bottom etch target layers.

Figure 10:
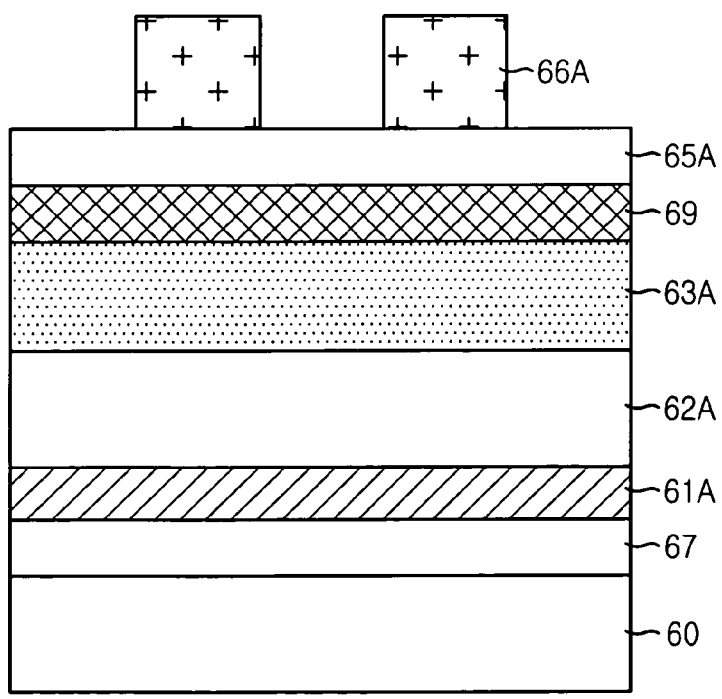
FIG. 10 is a cross-sectional view showing a stack structure for forming a conductive pattern by using an amorphous carbon layer as a sacrificial hard mask in accordance with a third embodiment of the present invention.

FIG. 10 is a cross-sectional view showing a stack structure for forming a conductive pattern by using an amorphous carbon layer as a sacrificial hard mask in accordance with a third embodiment of the present invention. Herein, the same reference numerals are used for those substantially identical configuration elements described in the first embodiment and the second embodiment.

As shown, a first conductive layer 67 made of TiN or polysilicon and a second conductive layer 61A made of tungsten are sequentially formed on a substrate 60. Then, an insulation layer 62A for use in a hard mask is formed on the second conductive layer 61A. The insulation layer 62A, the second conductive layer 61A and the first conductive layer 67 are patterned to form a bit line or the like. On top of the insulation layer 62A, an amorphous carbon layer 63A for use in a sacrificial hard mask is formed, being overlaid with a dual sacrificial hard mask layer 69 obtained through sequentially stacking a nitride layer and a polysilicon layer. An anti-reflective coating layer 65A and a photoresist pattern 66A are formed on the dual sacrificial hard mask layer 69.

The polysilicon layer of the dual sacrificial hard mask layer 69 has a thickness ranging from approximately 200 Å to approximately 1,000 Å. Because of this thickness, it is possible to perform an etching process even though the photoresist pattern 66A is thinly formed. Since the polysilicon layer of the dual sacrificial hard mask layer 69 is sufficient to function as an etch mask, the nitride layer disposed beneath the polysilicon layer is formed in a thickness that allows an etching of the amorphous carbon layer 63A. That is, the thickness of the nitride layer is greater than approximately 200 Å. At this time, the nitride layer can be substituted with a material selected from a group consisting of oxide, nitride, oxynitride and a combination thereof. The amorphous carbon layer 63A is formed in a thickness greater than at least approximately 1,000 Å, typically, greater than approximately 2,000 Å for the purpose of securing an intended level of etch selectivity with respect to the bottom etch target layers.

Figure 11:
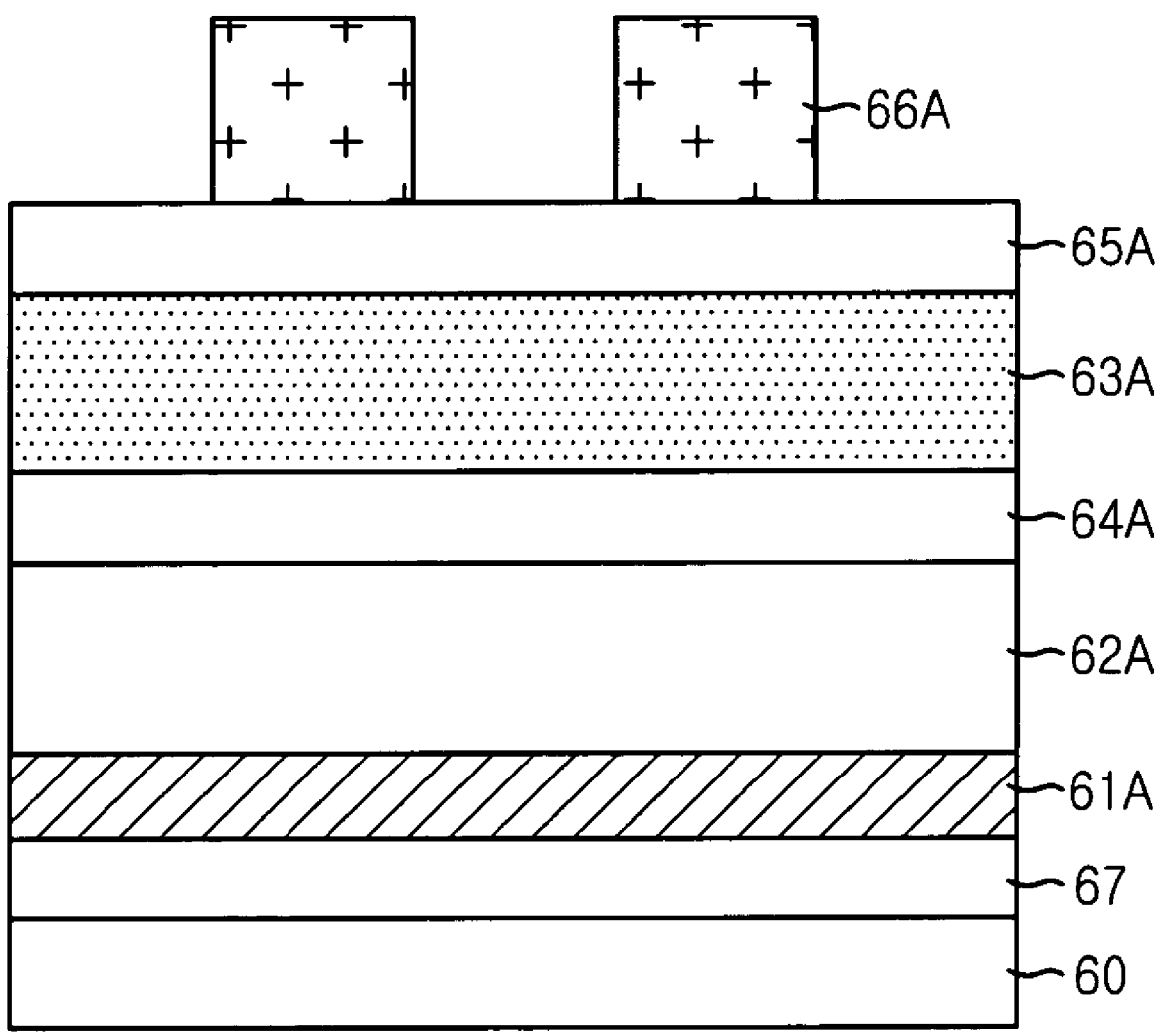
FIG. 11 is a cross-sectional view showing a stack structure for forming a conductive pattern by using an amorphous carbon layer as a sacrificial hard mask in accordance with a fourth embodiment of the present invention.

FIG. 11 is a cross-sectional view showing a stack structure for forming a conductive pattern by using an amorphous carbon layer as a sacrificial hard mask in accordance with a fourth embodiment of the present invention. Herein, the same reference numerals are used for those substantially identical configuration elements described in the first embodiment to the third embodiment.

As shown, a first conductive layer 67 made of TiN or polysilicon and a second conductive layer 61A made of tungsten are sequentially formed on a substrate 60. Then, an insulation layer 62A for use in a hard mask is formed on the second conductive layer 61A. The insulation layer 62A, the second conductive layer 61A and the first conductive layer 67 are patterned to form a bit line or the like. On top of the insulation layer 62A, a nitride-based sacrificial hard mask layer 64A and an amorphous carbon layer 63A for use in a sacrificial hard mask are sequentially formed. An anti-reflective coating layer 65A is then formed on the amorphous carbon layer 63A, and a photoresist pattern 66A is formed on the anti-reflective coating layer 65A.

In the fourth embodiment, the anti-reflective coating layer 65A uses SiON, which is an inorganic material, and the amorphous carbon layer 63A is disposed beneath the anti-reflective coating layer 65A. Also, the anti-reflective coating layer 65A is intended to provide the originally assigned functions and an additional function as a sacrificial hard mask. Thus, the anti-reflective coating layer 65A is formed in a thickness ranging from approximately 200 Å to approximately 1,000 Å to realize the etching process even with the thinly formed photoresist pattern 66A.

Also, the anti-reflective coating layer 65A and the sacrificial hard mask layer 64A can be substituted with a material selected from a group consisting of oxide, nitride, oxynitride and a combination thereof. The amorphous carbon layer 63A is formed in a thickness greater than at least approximately 1,000 Å, typically, greater than approximately 2,000 Å for the purpose of securing an intended level of etch selectivity with respect to the bottom etch target layers.

FIGS. 12A to 12D are cross-sectional views illustrating a method for forming a pattern in a semiconductor device by employing a $F_2$ or ArF photolithography process in accordance with a fifth embodiment of the present invention.

In the fifth embodiment, the exemplified pattern is for forming a contact hole. More specifically, this contact hole pattern can be applicable to a metal line contact, a contact between one of a bit line and a storage node of a capacitor and an impurity junction such as a source/drain and a contact pad. Also, the contact hole pattern can be applicable to a process for forming a trench for device isolation in which an etch target is an insulation layer and to a process for etching an etch target based on a conductive material, e.g., a polysilicon layer, to open a channel region of a thin film transistor. That is, these pattern formation processes are negative type of patterns.

Figure 12A:
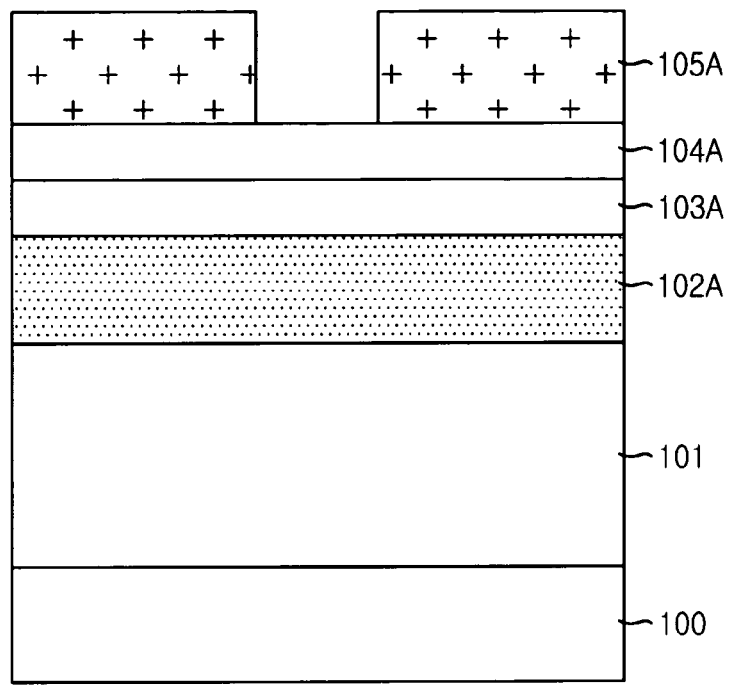
FIGS. 12A to 12D are cross-sectional views illustrating a method for forming a pattern in a semiconductor device by employing a $F_2$ or ArF photolithography process in accordance with a fifth embodiment of the present invention.

Referring to FIG. 12A, an insulation layer 101 is formed as an etch target layer on a substrate 100 provided with various device elements. The insulation layer 101 includes an impurity doped or impurity non-doped oxide or nitride layer. Afterwards, an amorphous carbon layer 102A for use in a sacrificial hard mask is formed on the insulation layer 101 to prevent an incidence of pattern deformation caused by damages on the insulation layer 101 during an etching process. A sacrificial hard mask layer 103A is then formed on the amorphous carbon layer 102A.

Herein, the amorphous carbon layer 102A includes a composition of carbon similarly found in photoresist, and thus, the use of a photoresist pattern decreases etching efficiency. For this reason, an additional sacrificial hard mask is formed between the amorphous carbon layer 102A and the photoresist pattern, which will be formed subsequently. The sacrificial hard mask layer 103A is formed by using a material selected from a group consisting of polysilicon, Al, W, $WSi_x$, WN, Ti, TiN, $TiSi_x$, TiAlN, TiSiN, Pt, Ir, $IrO_2$, Ru, $RuO_2$, Ag, Au, Co, TaN, CrN, CoN, MoN, $MoSi_x$, $Al_2O_3$, AlN, $PtSi_x$ and $CrSi_x$. Herein, 'x' represents an atomic ratio of silicon ranging from approximately 1 to approximately 2.

If a sacrificial hard mask is formed in a structure of a tungsten layer/a nitride or oxide layer/an amorphous carbon layer, a thickness of the tungsten layer is set to be less than approximately 300 Å to block the tungsten layer from affecting etch selectivity of the photoresist pattern. Even if a high resolution patterning process is applied, for instance, in case of an ArF photolithography, a thickness of the photoresist pattern is set to be approximately 1,000 Å. That is, approximately 1,000 Å of the photoresist pattern is sufficient to etch the tungsten layer of which thickness is within a range of approximately 300 Å. Meanwhile, the nitride or oxide layer disposed beneath the tungsten layer is formed in a thickness ranging from approximately 300 Å to approximately 600 Å to realize the etching of approximately 300 Å of the tungsten layer. After the tungsten layer and the nitride or oxide layer are etched, the amorphous carbon layer is etched. For the etching of the amorphous carbon layer, if an etch gas of $N_2$ gas or $O_2$ gas is employed, an etch selectivity ratio of the nitride or oxide layer to the amorphous carbon layer is above approximately 20 to approximately 1. This etch selectivity ratio value indicates that approximately 300 Å to approximately 600 Å of the nitride or oxide layer is capable of etching approximately 6,000 Å to approximately 12,000 Å of the amorphous carbon layer. The amorphous carbon layer with the thickness above at least 6,000 Å is then capable of etching more than approximately 10,000 Å of the insulation layer 101 without a difficulty.

Next, an anti-reflective coating layer 104A is formed on the sacrificial hard mask layer 103A to prevent formation of an undesired pattern due to scattering reflection caused by a high index of reflection of the amorphous carbon layer 102A during a photo-exposure process for forming an intended pattern and to improve adhesion between the sacrificial hard mask layer 103A and the photoresist pattern which will be formed subsequently. Herein, the anti-reflective coating layer 104A can use an organic material having a similar etch characteristic of the photoresist pattern or an inorganic material such as SiON.

Next, although not illustrated, a photoresist layer for use in a $F_2$ or ArF photolithography process is formed on the ARC layer 104A by employing a spin coating method until an intended thickness of the photoresist layer is obtained. At this time, the photoresist layer is made of cycloolefin-maleic anhydride (COMA) or acrylate. Thereafter, a portion of the photoresist layer is selectively photo-exposed through the use of a photo-exposure device for $F_2$-laser or ArF and a predetermined reticle (not shown) for defining a width of a bit line structure. A developing process is then performed to make a photo-exposed portion or non-photo-exposed portion of the photoresist layer remain. Subsequent to the developing process, a cleaning process is performed to remove etch remnants, thereby completing formation of a photoresist pattern 105A.

Figure 12B:
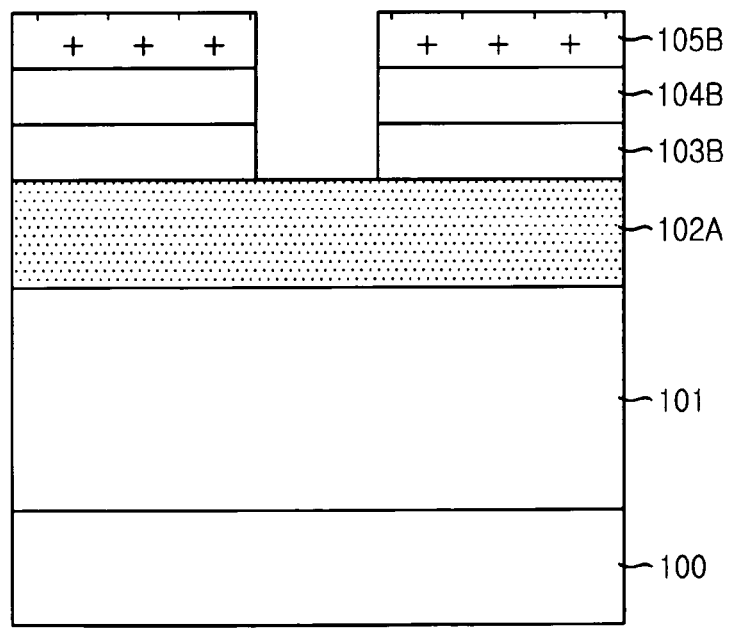

Referring to FIG. 12B, the ARC layer 104A shown in FIG. 12A is selectively etched by using the photoresist pattern 105A as an etch mask, thereby forming a patterned ARC layer 104B. At this time, the above etching process proceeds by using preferably a plasma containing a chorine-based gas such as $Cl_2$, $BCl_3$, $CCl_4$ or HCl to minimize losses of the photoresist pattern 105A. In case that a carbon fluoride (CF)-based gas is used, the etching process proceeds by using preferably a plasma containing a gas that gives a low ratio of carbon to fluorine. Such gas is selected from a group consisting of $CF_4$, $C_2F_2$, $CHF_3$ and $CH_2F_2$. The above mentioned gas is selected to minimize generation of polymers during the etching process since it is necessary to control a CD during the etching of the ARC layer 104A shown in FIG. 12A. Also, it should be noted that a reference denotation 105B denotes a remaining photoresist pattern after the above etching process.

Afterwards, the sacrificial hard mask layer 103A shown in FIG. 12A is etched by using the remaining photoresist pattern 105B as an etch mask to form a first sacrificial hard mask 103B.

Hereinafter, the etching of the sacrificial hard mask layer 103A will be described in more detail. If the sacrificial hard mask layer 103A includes a tungsten-based layer formed by using a material such as W, $WSi_x$ or WN, a plasma containing a mixed gas of $SF_6$ gas and $N_2$ gas is used for this etching process. At this time, the mixing ratio of the $SF_6$ gas to $N_2$ gas preferably ranges from approximately 0.10 to approximately 0.60.

If the sacrificial hard mask layer 103A includes a polysilicon layer and a titanium-based layer formed by using a material selected from a group consisting of Ti, TiN, $TiSi_x$, TiAlN, and TiSiN, a gas based on a family of chorine, especially, chlorine ($Cl_2$) gas is used as a main etch gas. In addition to the main etch gas, adequate amounts of $O_2$ gas and CF gas are added to control an etch profile.

If the sacrificial hard mask layer 103A includes a noble metal such as Pt, Ir, Ru or oxide thereof, a plasma containing a chlorine-based gas or a fluorine-based gas is used. At this time, high ion energy is required to control the etch profile, and the etching process is carried out preferably by maintaining a condition of low pressure and high bias power.

Figure 12C:
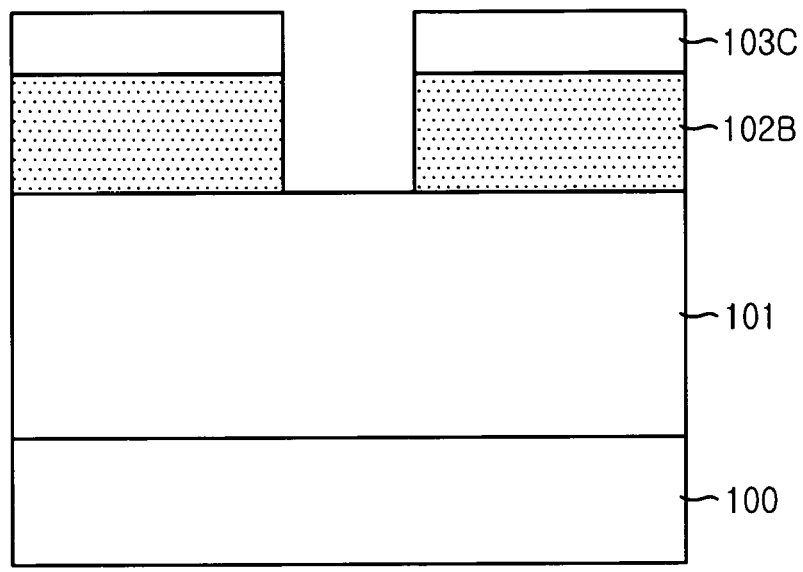

Referring to FIG. 12C, with using at least the first sacrificial hard masks 103B as an etch mask, the amorphous carbon layer 102A shown in FIG. 12B is etched by using $N_2$ gas or $O_2$ gas, thereby forming a second sacrificial hard mask 102B. At this time, the remaining photoresist pattern 105B and the patterned ARC layer 104B are almost removed or remain partially and thus, the remaining photoresist pattern 105B and the patterned ARC layer 104B can still act as an etch mask if not being removed through a separate photoresist stripping process. Also, since an etch selectivity ratio between the first sacrificial hard mask 103B and the amorphous carbon layer 102A is high, it is possible to secure a sufficient thickness of the second sacrificial hard mask 102B. Herein, a reference numeral 103C denotes a remaining first sacrificial hard mask after this etching process.

Figure 12D:
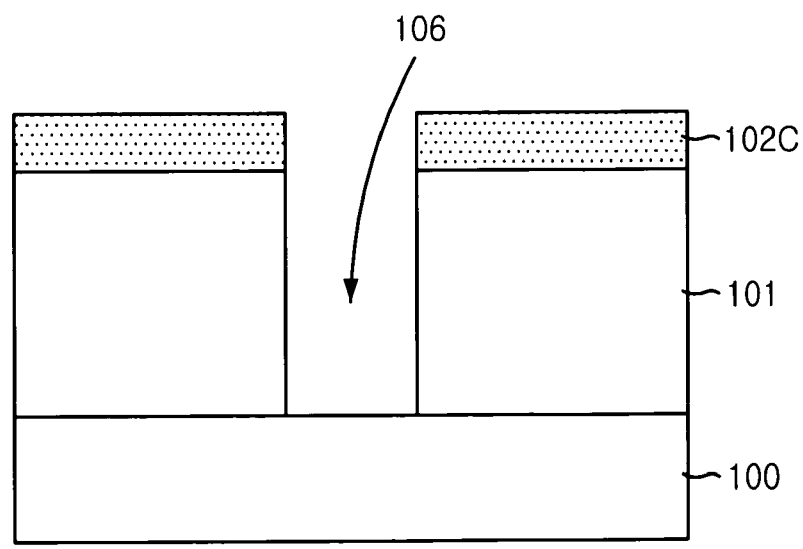

Referring to FIG. 12D, the insulation layer 101 shown in FIG. 12C is selectively etched by employing the second sacrificial hard mask 102B as an etch mask to form a contact hole 106 exposing the substrate 100, more particularly a conductive structure. A reference denotation 102C represents a remaining second sacrificial hard mask after the etching process.

Next, the remaining second sacrificial hard mask 102C is removed. Through using oxygen plasma, the remaining second sacrificial hard mask 102C can be removed without difficulty since the remaining second sacrificial hard mask 102C is an amorphous carbon layer. At this time, since it is possible to secure a sufficient thickness of the remaining second sacrificial hard masks 102C, an etch characteristic of the remaining second sacrificial hard masks 102C can be maintained. As a result, it is possible to prevent an increase or a decrease of a critical dimension of the contact hole 106 usually caused by losses of the sacrificial hard mask and the pattern deformation.

For the insulation layer 101, an oxide-based material is mainly used. Hereinafter, an etching recipe for the oxide-based material will be explained in more detail.

A CF-based gas, which is typically used for etching the oxide layer, is used to etch the insulation layer 101. The CF-based gas is selected from a group consisting of $CF_4$, $CHF_3$, $CH_2F_2$, $C_4F_6$, $C_4F_8$, $C_3F_8$ and $C_5F_8$. Also, the etching of the insulation layer 101 is carried out at a magnetic enhancement reactive ion etching (MERIE) apparatus by providing the CF-based gas in an amount ranging from approximately 20 sccm to approximately 100 sccm under approximately 1,000 W to approximately 2,500 W of power. At this time, a pressure of the MERIE apparatus is maintained in a range from approximately 25 mtorr to approximately 70 mtorr, and a cathode temperature ranges from approximately −20° C. to approximately +60° C. To control the etch profile, $O_2$ gas can be additionally added with an amount that is approximately 65% to approximately 80% of the CF-based gas.

Figure 13:
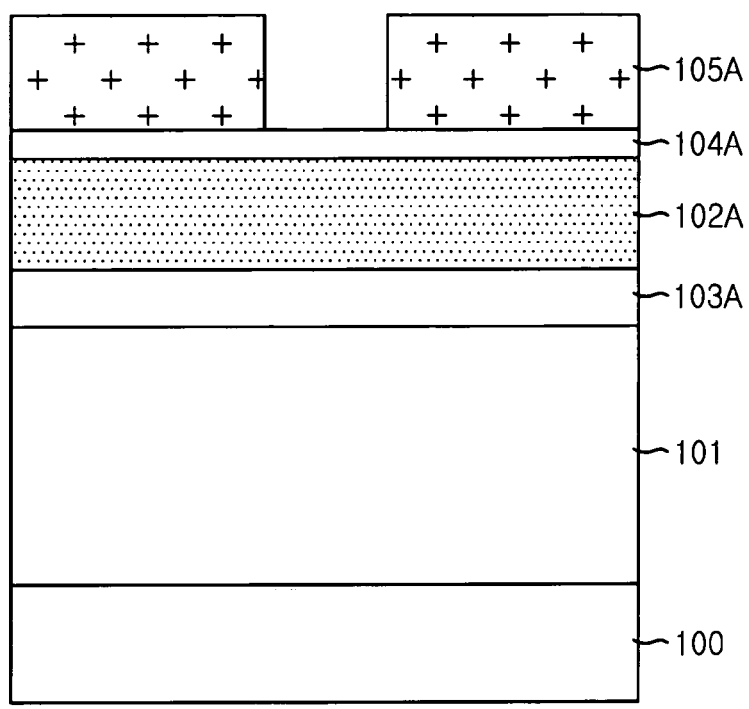
FIG. 13 is a cross-sectional view showing a stack structure for forming a contact hole by using an amorphous carbon layer as a sacrificial hard mask in accordance with a sixth embodiment of the present invention.

FIG. 13 is a cross-sectional view showing a stack structure for forming a contact hole by using an amorphous carbon layer as a sacrificial hard mask in accordance with a sixth embodiment of the present invention. Herein, the same reference numerals will be used for those substantially identical configuration elements described in the fifth element.

As shown, an insulation layer 101, which is an etch target layer and a sacrificial hard mask layer 103A are sequentially formed on a substrate 100. An amorphous carbon layer 102A is formed on the sacrificial hard mask layer 103A. An ARC layer 104A and a photoresist pattern 105A are sequentially formed on the amorphous carbon layer 102A.

In the sixth embodiment, the ARC layer 104A employs SiON, which is an inorganic material. Also, the ARC layer 104A serves the originally assigned functions and an additional function as the sacrificial hard mask. To realize these functions, the ARC layer 104A is formed in a thickness ranging from approximately 200 Å to approximately 1,000 Å, so that a sufficient degree of the etching can be achieved even with use of the thin photoresist pattern.

Also, the ARC layer 104A and the sacrificial hard mask layer 103A can be substituted with a material selected from a group consisting of oxide, nitride, oxynitride and a combination thereof. Especially, the amorphous carbon layer 102A is formed in a thickness greater than at least 1,000 Å, typically, greater than approximately 2,000 Å to secure an intended level of etch selectivity with respect to the bottom etch target layers.

Figure 14:
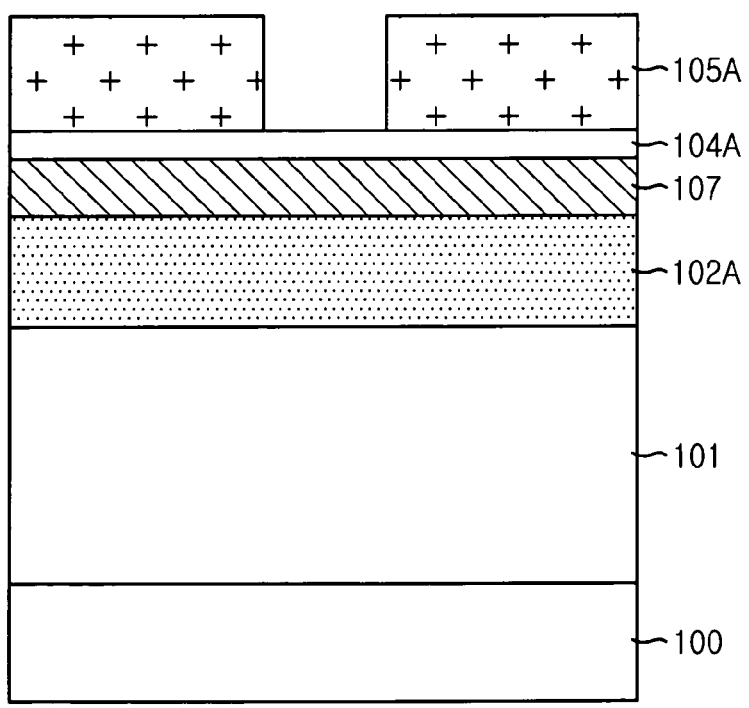
FIG. 14 is a cross-sectional view showing a stack structure for forming a contact hole by using an amorphous carbon layer as a sacrificial hard mask in accordance with a seventh embodiment of the present invention.

FIG. 14 is a cross-sectional view showing a stack structure for forming a contact hole by using an amorphous carbon layer as a sacrificial hard mask in accordance with a seventh embodiment of the present invention. Herein, the same reference numerals are used for those substantially identical configuration elements described in the fifth embodiment and the sixth embodiment.

As shown, an insulation layer 101 and an amorphous carbon layer 102A for use in a sacrificial hard mask are sequentially formed on a substrate 100. A sacrificial hard mask layer 107 is formed by sequentially stacking a nitride layer and a tungsten layer on the amorphous carbon layer 102A. On the sacrificial hard mask layer 107, an ARC layer 104A and a photoresist pattern 105A are formed on the sacrificial hard mask layer 107.

The tungsten layer of the sacrificial hard mask layer 107 has a thickness ranging from approximately 200 Å to approximately 1,000 Å. Because of this thickness, it is possible to perform an etching process even though the photoresist pattern 105A is thinly formed. Since the tungsten layer of the sacrificial hard mask layer 107 is sufficient to function as an etch mask, the nitride layer disposed beneath the tungsten layer is formed in a thickness that causes the amorphous carbon layer 102A to be etched. That is, the thickness of the nitride layer is greater than approximately 200 Å. At this time, the nitride layer can be substituted with a material selected from a group consisting of oxide, nitride, oxynitride and a combination thereof. The amorphous carbon layer 102A is formed in a thickness greater than at least approximately 1,000 Å, typically, greater than approximately 2,000 Å for the purpose of securing an intended level of etch selectivity with respect to the bottom etch target layers.

Figure 15:
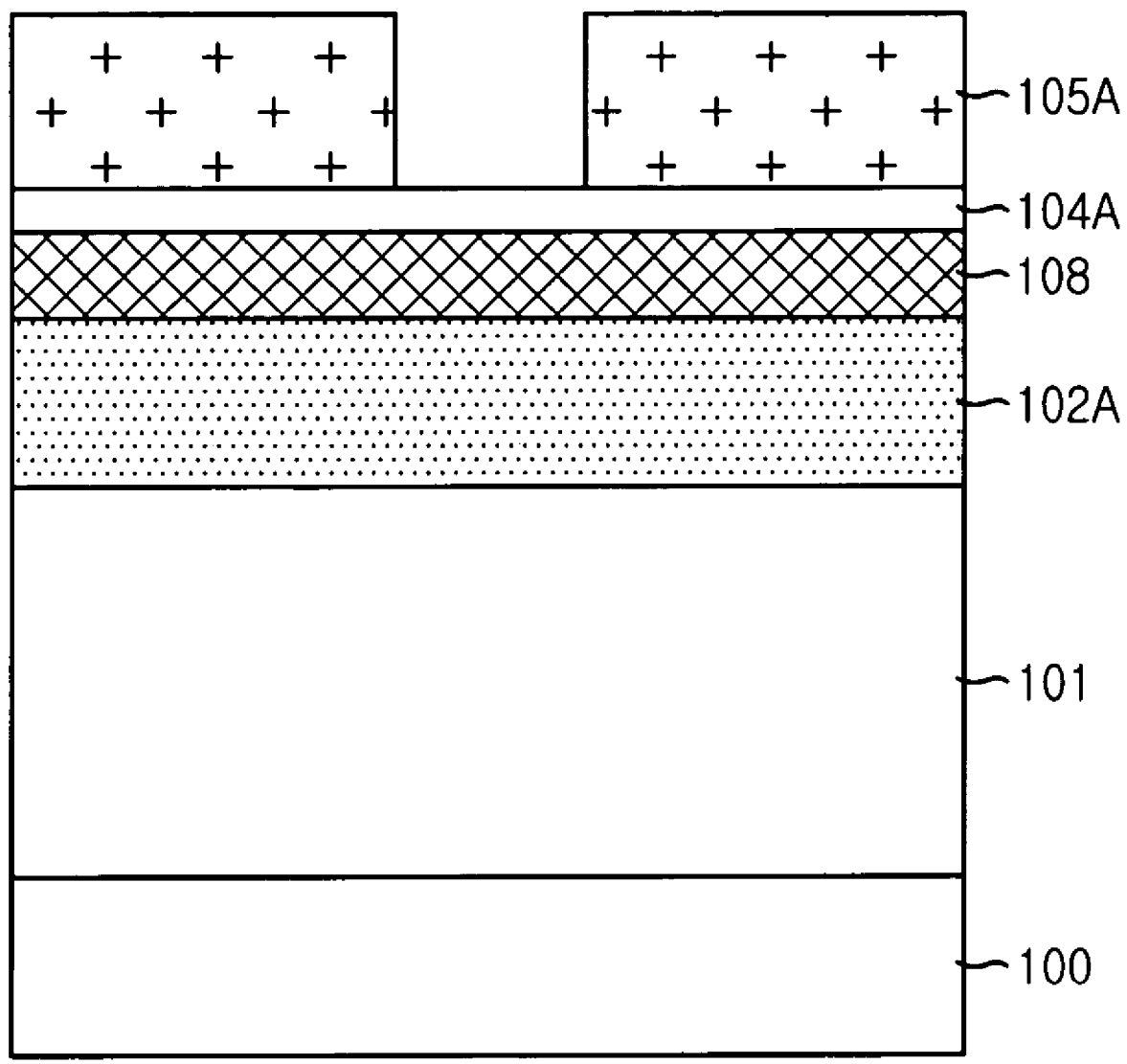
FIG. 15 is a cross-sectional view showing a stack structure for forming a contact hole by using an amorphous carbon layer as a sacrificial hard mask in accordance with an eighth embodiment of the present invention.

FIG. 15 is a cross-sectional view showing a stack structure for forming a contact hole by using an amorphous carbon layer as a sacrificial hard mask in accordance with an eighth embodiment of the present invention. Herein, the same reference numerals are used for those substantially identical configuration elements described in the fifth embodiment to the seventh embodiment.

As shown, an insulation layer 101, which is an etch target layer, and an amorphous carbon layer 102A are sequentially formed on a substrate 100. A sacrificial hard mask layer 108 is formed by sequentially stacking a nitride layer and a polysilicon layer on the amorphous carbon layer 102A. An ARC layer 104A and a photoresist pattern 105A are sequentially formed on the sacrificial hard mask layer 108.

The polysilicon layer of the sacrificial hard mask layer 108 is formed in a thickness ranging from approximately 200 Å to approximately 1,000 Å, so that the etching can be carried out even with using the thin photoresist pattern. Also, the nitride layer disposed beneath the polysilicon layer of the sacrificial hard mask layer 108 sufficiently serves the role as a mask, and thus, the nitride layer is formed in a thickness greater than approximately 200 Å to realize the etching of the amorphous carbon layer 102A.

In addition, the nitride layer can be substituted with a material selected from a group consisting of oxide, nitride, oxynitride and a combination thereof. The amorphous carbon layer 102A is formed in a thickness greater than at least approximately 1,000 Å, typically, greater than approximately 2,000 Å for the purpose of securing an intended level of etch selectivity with respect to the bottom etch target layers.

Hereinafter, a structure for forming a pattern for use in a contact hole will be carefully examined based on an exemplary case applied in a dynamic random access memory (DRAM) device.

Figure 16:
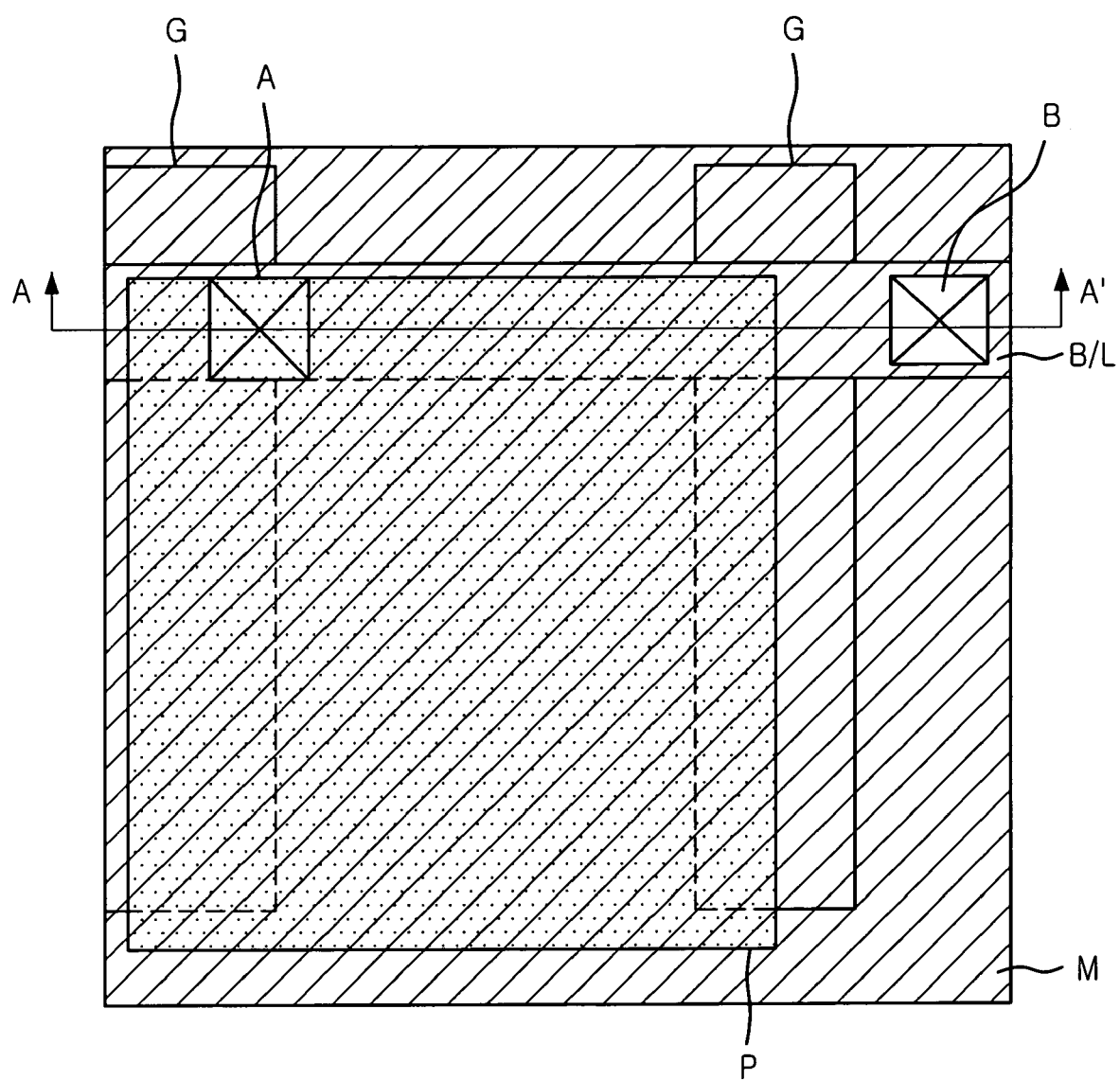
FIG. 16 is a top view showing a semiconductor device with a mask pattern for forming a metal line in accordance with a ninth embodiment of the present invention.

FIG. 16 is a top view showing a semiconductor device with a mask pattern for forming a metal line in accordance with a ninth embodiment of the present invention.

As shown, there are a number of gate electrodes G and on top of the selected gate electrode G, a bit line B/L is formed in a cross-direction to the selected gate electrodes G. Although not illustrated, there are a cell contact plug formed between the gate electrodes G, a storage node contact plug connected to the cell contact plug, a storage node connected to the storage node contact plug, and a dielectric layer formed on the storage node. On the dielectric layer, a plate electrode P is formed, being overlaid with a mask pattern M for forming a metal line contact. Herein, the gate electrodes G, the bit line B/L and the plate electrode P should be connected with the metal line to make a connection with signals and power lines. The mask pattern M is used for forming a contact A for a metal line connected with the plate electrode P and another contact B for a metal line connected with the bit line B/L.

Figure 17:
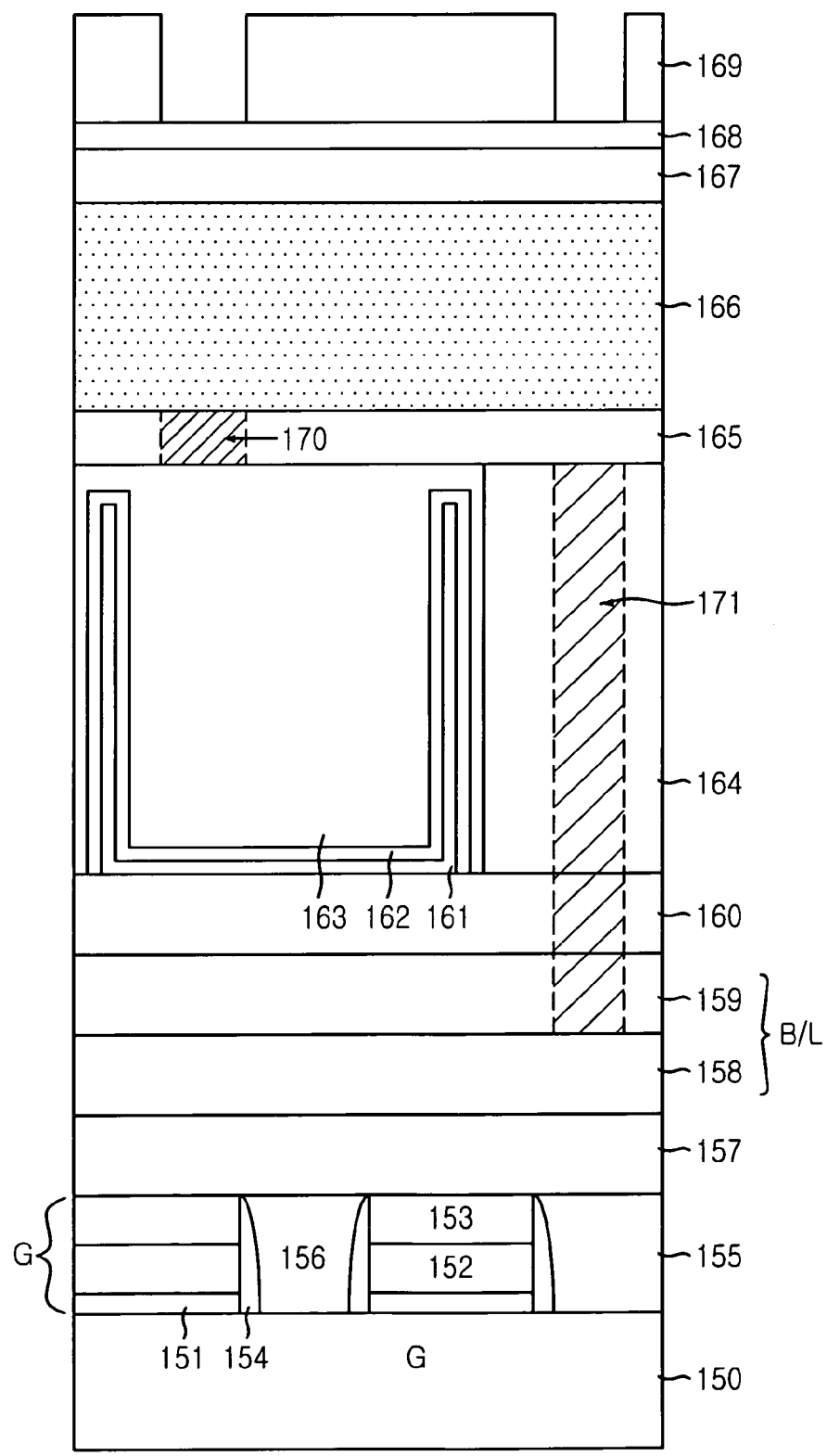
FIG. 17 is a cross-sectional view showing the semiconductor device taken along a line A-A' shown in FIG. 16.

FIG. 17 is a cross-sectional view showing the semiconductor device taken along a line A-A' shown in FIG. 16.

As shown, a plurality of the gate electrodes G each including a gate oxide layer 151, a gate conductive layer 152 and a gate hard mask 153 are formed on a substrate 150. On sidewalls of the individual gate electrodes G, spacers 154 are formed. Also, the gate electrodes G are encompassed by a first inter-layer insulation layer 155, and a cell contact plug 156 makes a contact with an impurity diffusion region of the substrate 150 by passing through the first inter-layer insulation layer 155 and, is planarized at the same level of the gate hard mask 153.

Afterwards, a second inter-layer insulation layer 157 is formed over the cell contact plug 156. The bit line B/L is formed on the second inter-layer insulation layer 157. Although it is not illustrated in this drawing, the bit line B/L is electrically connected with the cell contact plug 156 by passing through the second inter-layer insulation layer 157. The bit line B/L includes a bit line conductive layer 158 and a bit line hard mask layer 159, and although not illustrated, spacers are formed on sidewalls of the bit line B/L.

A third inter-layer insulation layer 160 is formed over the bit line B/L. Although not illustrated, a storage node contact plug that is electrically connected with the cell contact plug 156 by passing through the third inter-layer insulation layer 160 and the second inter-layer insulation layer 157 is formed on the third inter-layer insulation layer 160.

A storage node 161, a dielectric layer 162 and a plate electrode 163 denoted with 'P' in FIG. 16 are sequentially formed on the storage node contact plug, thereby forming a capacitor in a cell region. Also, a fourth inter-layer insulation layer 164 is formed in a region where the cell capacitor is not formed.

Next, a fifth inter-layer insulation layer 165 is formed on the cell capacitor and the fourth inter-layer insulation layer 164, and an amorphous carbon layer 166 for use in a sacrificial hard mask is formed on the fifth inter-layer insulation layer 165, being overlaid with a sacrificial hard mask layer 167. An ARC layer 168 and a photoresist pattern 169 are sequentially formed on the sacrificial hard mask layer 167.

A first etch target for forming the metal line connected with the plate electrode 163 is denoted with a reference numeral 170, and it is not difficult to apply the etching process to the first etch target 170 since the etch target 170 is encompassed by the fifth inter-layer insulation layer 165.

On the other hand, a second etch target for forming another metal line connected with the bit line B/L is denoted with a reference numeral 171. However, as shown in the drawing, the second etch target 171 is thick by including the fifth inter-layer insulation layer 165, the fourth inter-layer insulation layer 164 and the bit line hard mask layer 159. Especially, the thickness of the fourth inter-layer insulation layer 164 is identical to the height of the cell capacitor. For instance, the thickness of the foruth inter-layer insulation layer 164 is approximately 20,000 Å. Thus, the thickness of the second etch target 171 is greater than this mentioned thickness; that is, the thickness of the second etch target 171 is approximately 30,000 Å. Therefore, it is impossible to form a contact hole pattern by using only a conventional sacrificial hard mask particularly in sub-80 nm semiconductor technology.

However, using the amorphous carbon layer 166 maintained with a thickness greater than approximately 10,000 Å makes it possible to form an intended pattern without deformation when a deep contact hole is formed.

Figure 18:
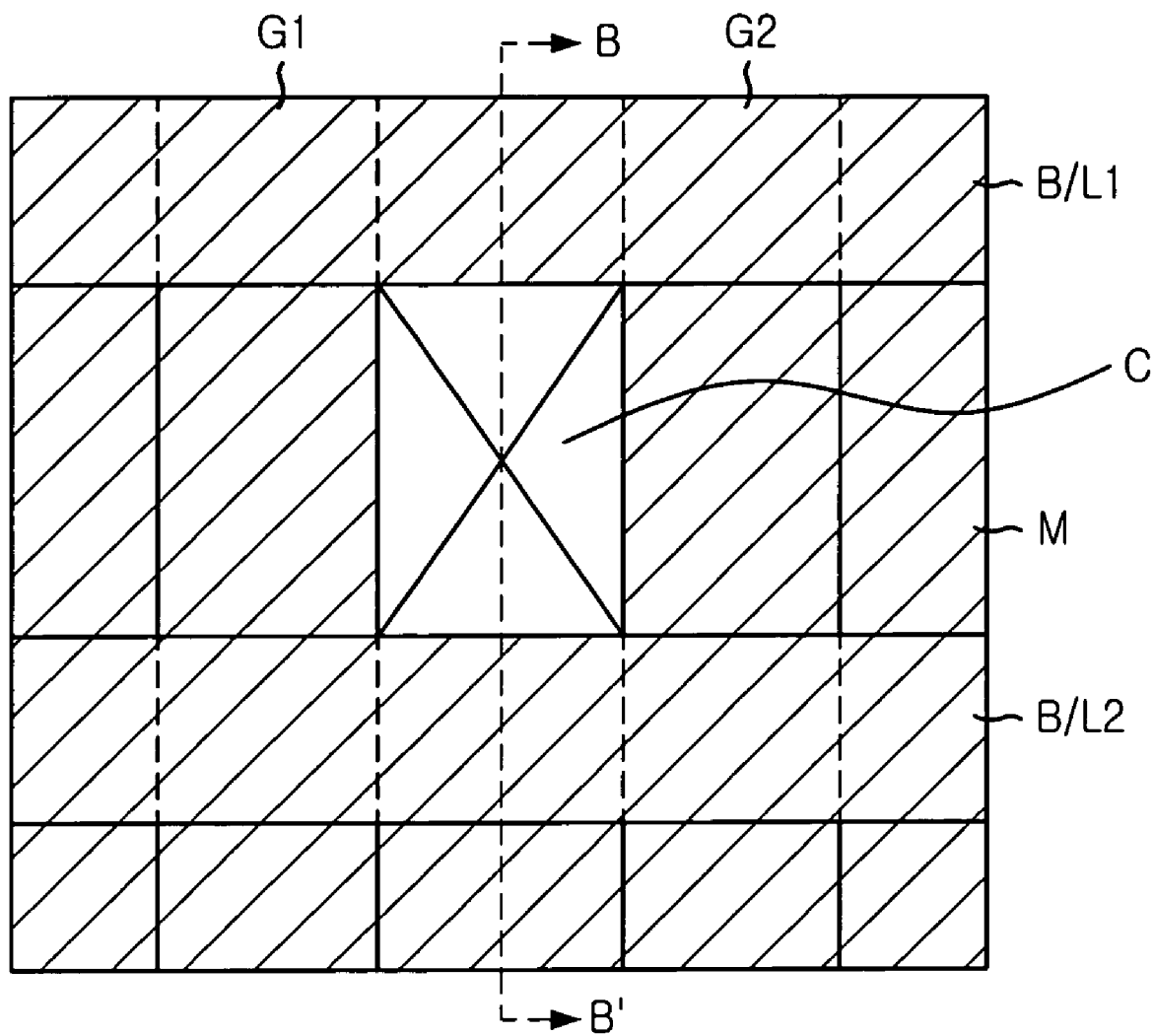
FIG. 18 is a top view showing a semiconductor device with a mask pattern for forming a storage node contact in accordance with a tenth embodiment of the present invention.

FIG. 18 is a top view showing a semiconductor device with a mask pattern for forming a storage node contact in accordance with a tenth embodiment of the present invention.

As shown, there are a plurality of gate electrodes G1 and G2 arranged with a predetermine distance. A plurality of bit lines B/L1 and B/L2 are formed above the plurality of gate electrodes G1 and G2 in a cross-direction to the gate electrodes G1 and G2. Although not illustrated, there is a cell contact plug formed between the gate electrodes G1 and G2. Also, a mask pattern M for forming a storage node contact hole is formed above the bit lines B/L1 and B/L2. Herein, the mask pattern M is aligned to one lateral side of each of the bit lines B/L1 and B/L2 and serves a role in exposing the cell contact plug at a region denoted with 'C'.

Figure 19:
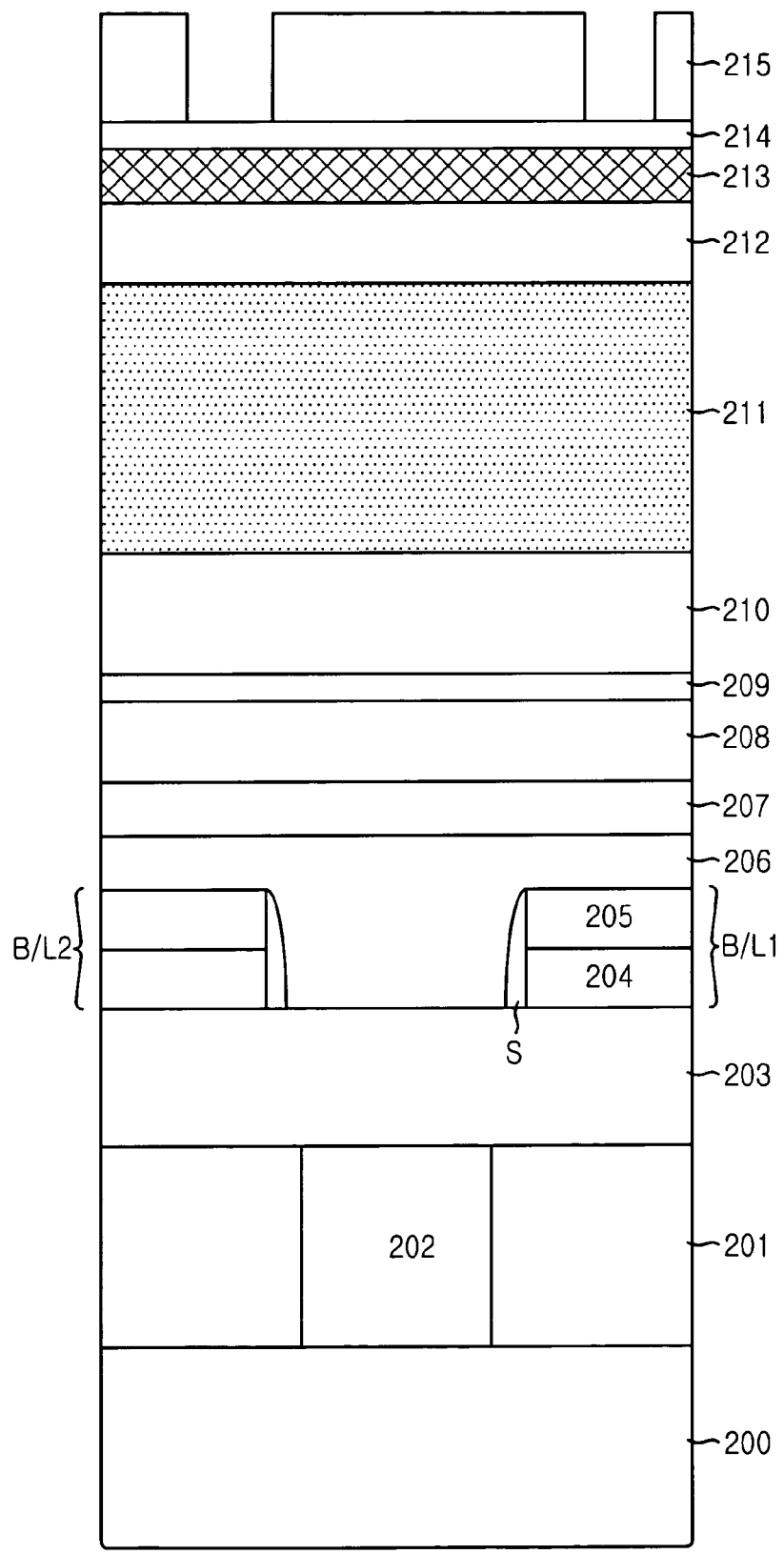
FIG. 19 is a cross-sectional view showing the semiconductor device taken along a line B-B' shown in FIG. 18.

FIG. 19 is a cross-sectional view showing the semiconductor device taken along a line B-B' shown in FIG. 18.

As shown, although the gate electrodes G1 and G2 are formed on a substrate 200, they are not shown in this drawing when viewed in a direction of the line B-B'. The gate electrodes G1 and G2 are encompassed by a first inter-layer insulation layer 201, and a contact plug 202 formed in a cell region is connected with an impurity diffusion region of the substrate 200 by passing through the first inter-layer insulation layer 201 and is planarized at the same level of a gate hard mask (not shown).

A second inter-layer insulation layer 203 is formed over the contact plug 202, and on top of the second inter-layer insulation layer 203, a plurality of bit lines B/L1 and B/L2 are formed. Although not illustrated, the bit lines B/L1 and B/L2 are electrically connected with the contact plug 202 by passing through the second inter-layer insulation layer 203. Each of the bit lines B/L1 and B/L2 includes a stack structure including a bit line conductive layer 204 and a bit line hard mask layer 205, and on sidewalls of the individual bit lines B/L1 and B/L2, spacers S are formed.

A third inter-layer insulation layer 206 is formed over the bit lines B/L1 and B/L2. A storage node hard mask layer 207 for preventing the bottom structure from being damaged during formation of a storage node, and an oxide layer 208 are formed on the third inter-layer insulation layer 206. At this time, the oxide layer 208 is formed by employing a plasma enhanced chemical vapor deposition (PECVD) method with use of a material of tetraethylorthosilicate (TEOS). An etch stop layer 209 and an insulation layer 210 for use in a sacrificial hard mask are sequentially formed on the oxide layer 208. Herein, the insulation layer 210 is formed by employing nitride or oxide.

On the insulate layer 210, an amorphous carbon layer 211 for use in a sacrificial hard mask is formed, overlaid with a silicon oxynitride layer 212 for use in the sacrificial hard mask. Then, a tungsten layer 213 for use in the sacrificial hard mask is formed on the silicon oxynitride layer 212. An ARC layer 214 and a photoresist pattern 215 are sequentially formed on the tungsten layer 213.

For the storage node contact hole process, there are typically observed problems of an insufficient overlay margin and a thick etch target for forming the storage node contact hole. However, the use of the amorphous carbon layer maintained with the thickness greater than approximately 10,000 Å as the sacrificial hard mask makes it possible to obtain desired patterns without deformation.

Figure 20:
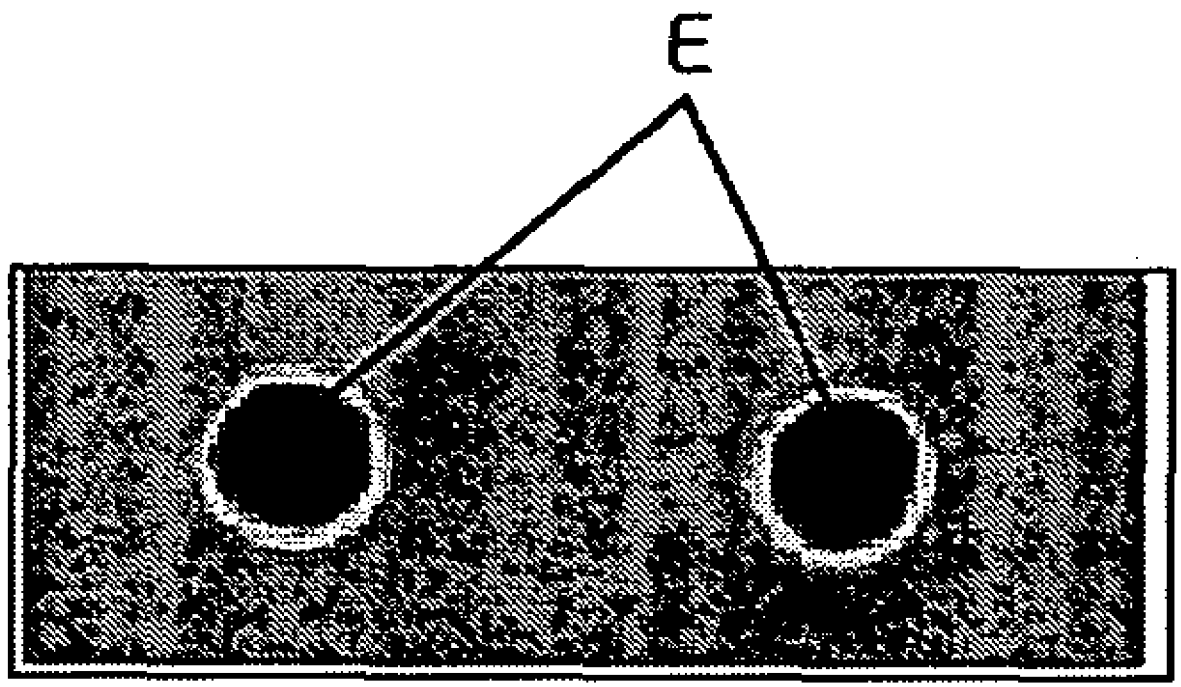
FIG. 20 is a micrograph showing a top view of contact holes formed through an ArF photolithography process.

FIG. 20 is a micrograph showing a top view of contact holes by employing an ArF photolithography process.

Figure 1A:
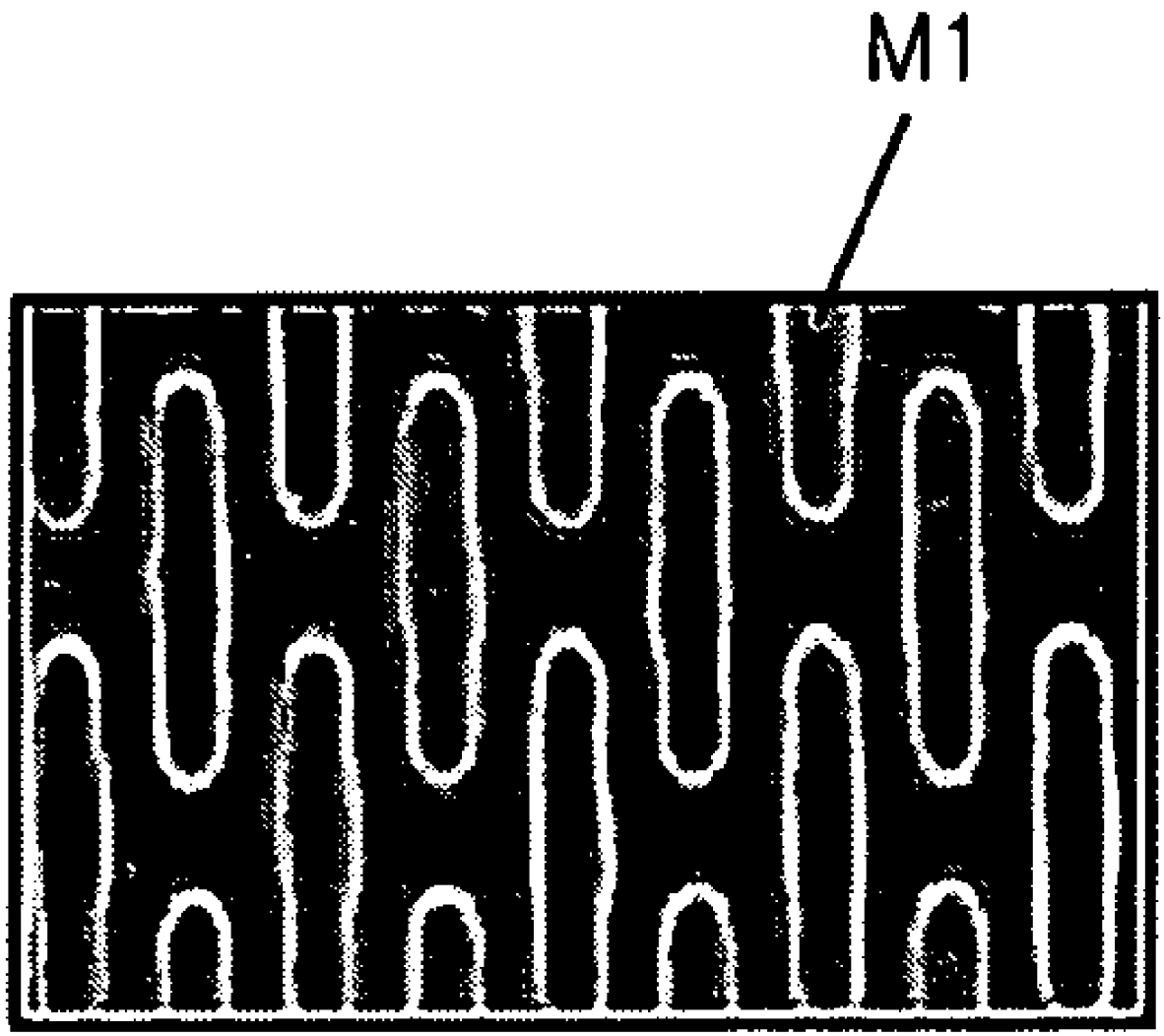
FIG. 1A is a micrograph showing a top view of a conventional line-type mask pattern obtained through a KrF photolithography process.
Figure 1B:
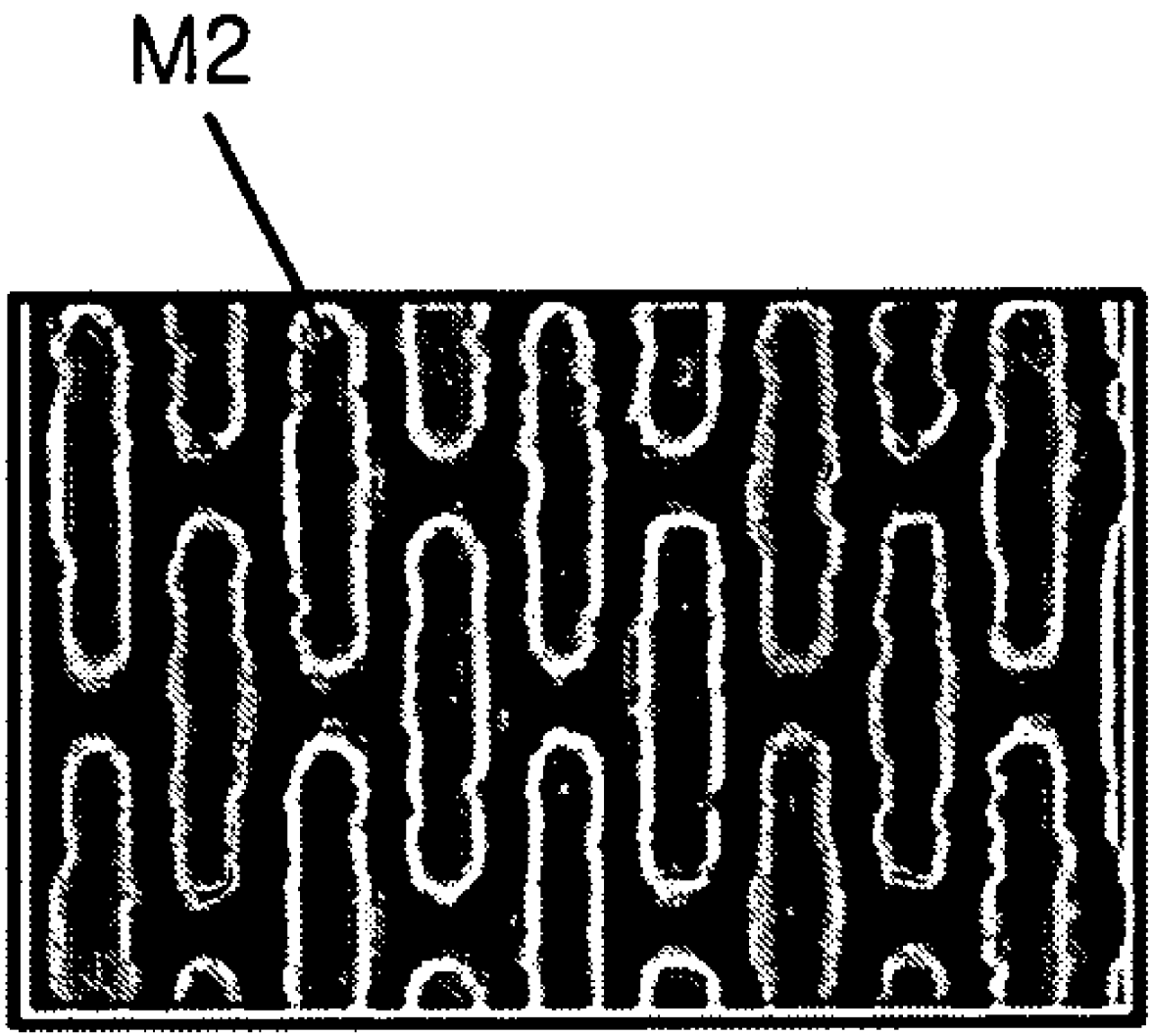
FIG. 1B is a micrograph showing a top view of a conventional line-type mask pattern obtained through an ArF photolithography process.
Figure 2A:
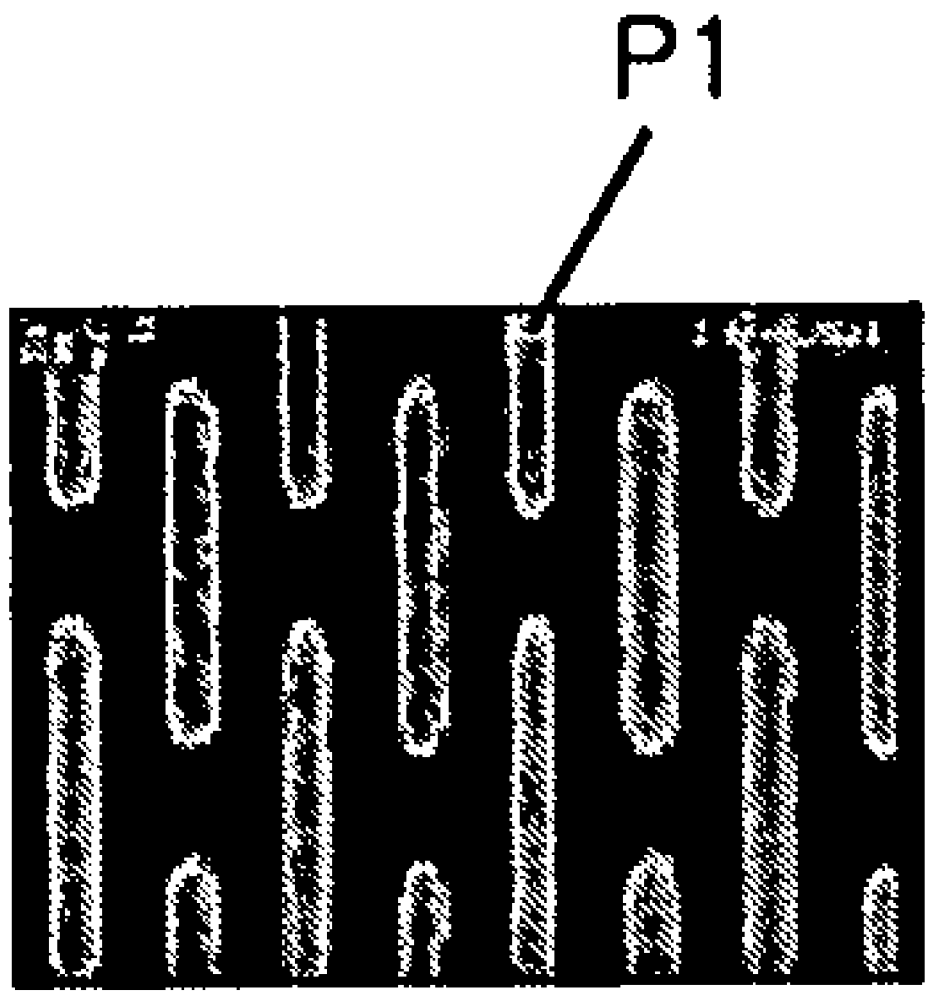
FIG. 2A is a micrograph showing a top view of a target pattern formed through an etching process with use of the line-type mask pattern shown in FIG. 1A.
Figure 2B:
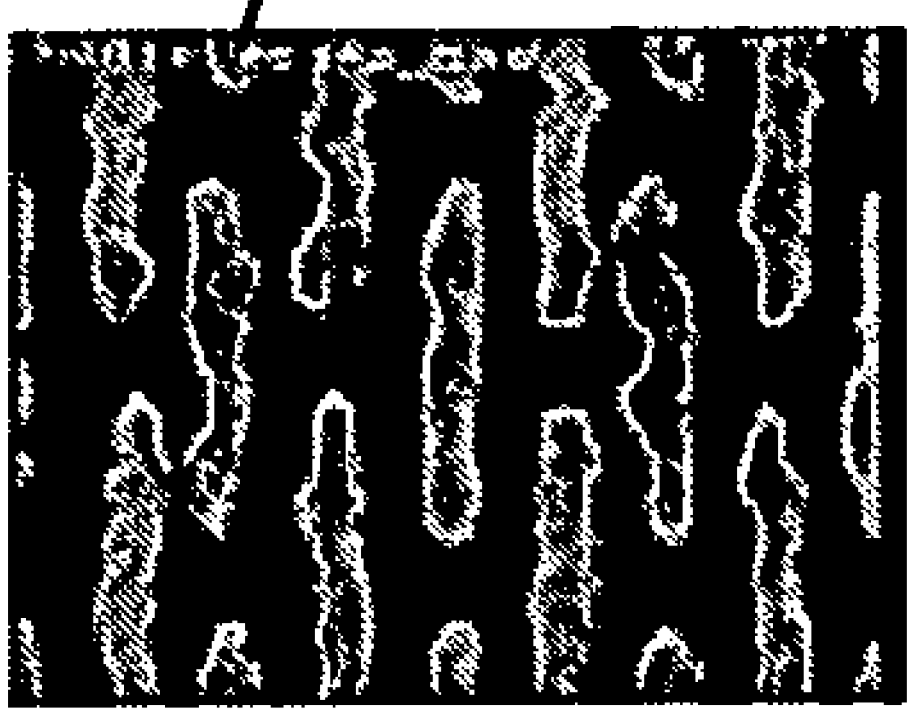
FIG. 2B is a micrograph showing a top view of a target pattern formed through an etching process with use of the line-type mask pattern shown in FIG. 1B.
Figure 3A:
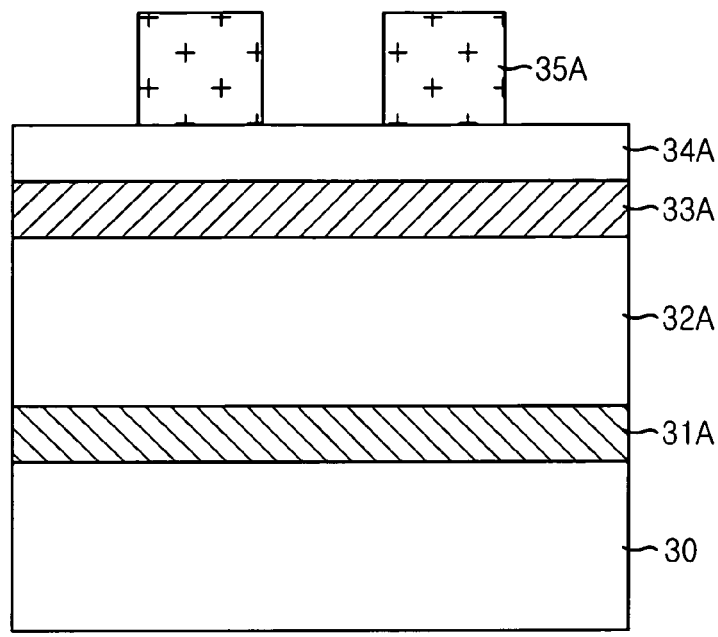
FIGS. 3A to 3D are cross-sectional views illustrating a conventional method for forming a pattern in a semiconductor device by employing a $F_2$ or ArF photolithography process.
Figure 3B:
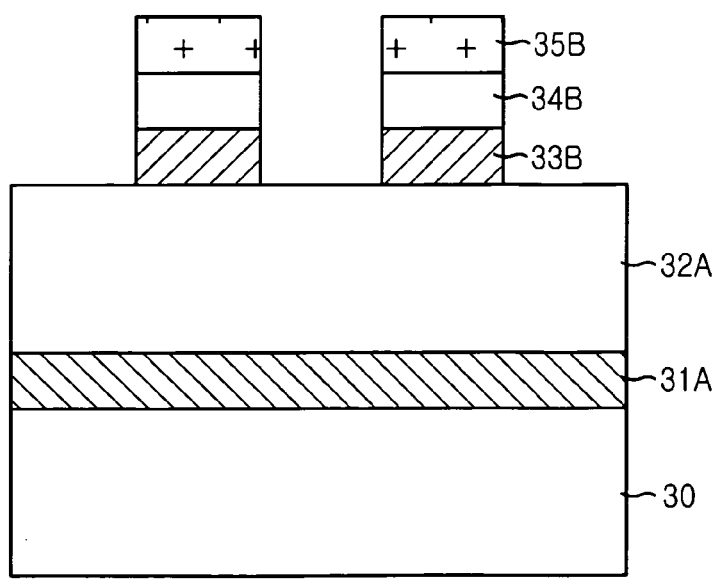
Figure 3C:
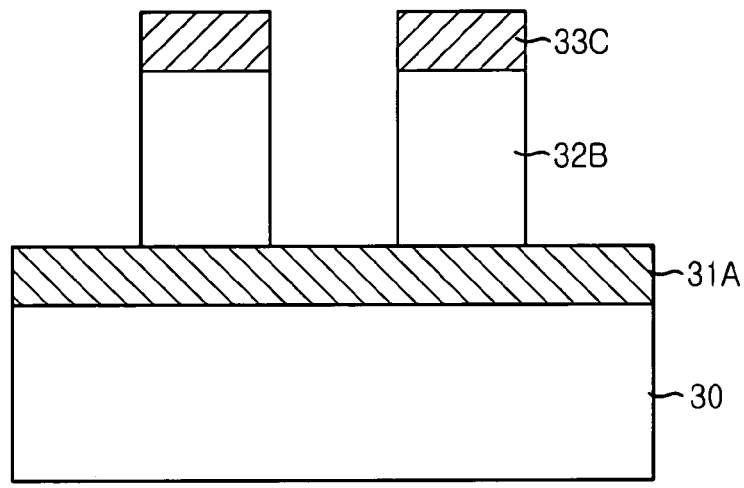
Figure 3D:
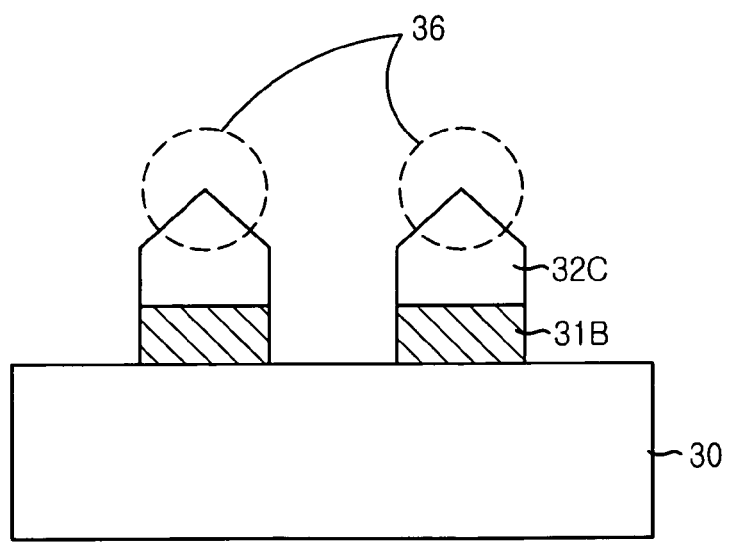
Figure 4:
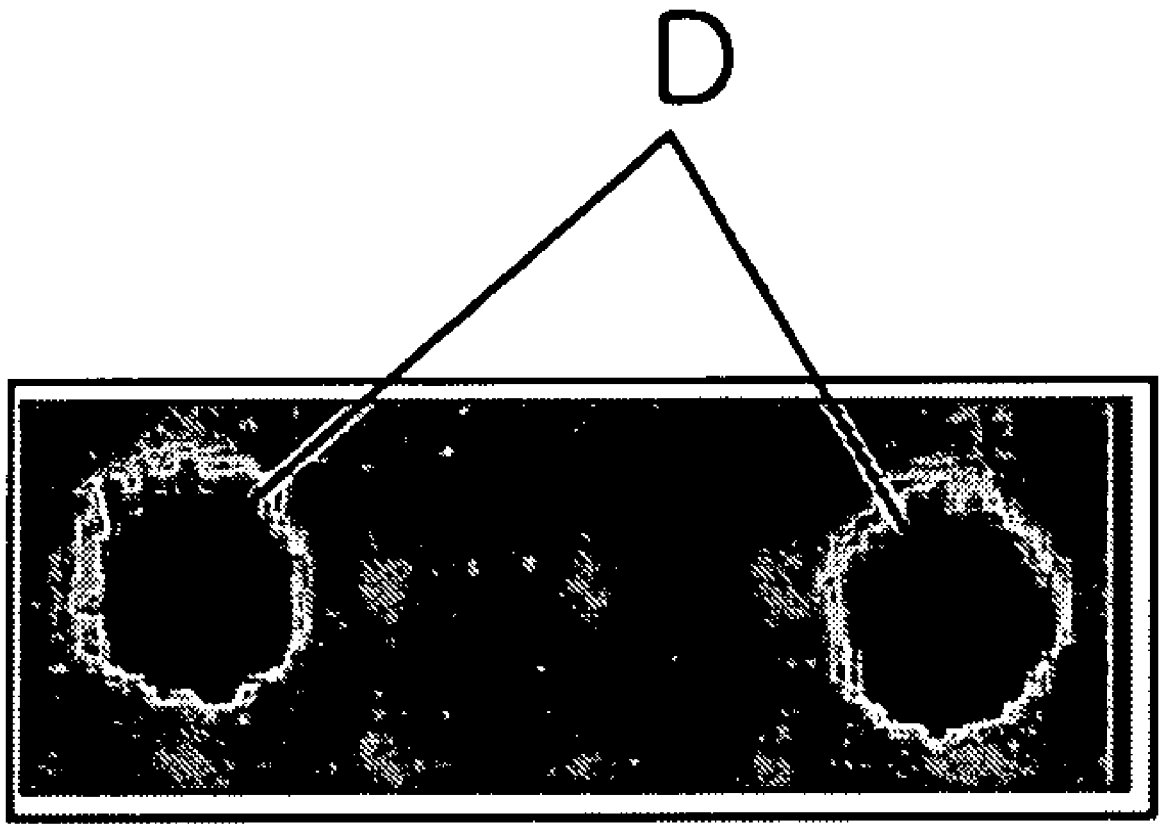
FIG. 4 is a micrograph showing a top view of contact holes obtained through a conventional ArF photolithography process.

As mentioned in FIG. 4, the conventional method cannot be free from an incidence of pattern deformation as denoted with 'D'. In contrast, as marked with a reference denotation 'E' in FIG. 20, the pattern deformation does not occur when the sacrificial hard mask based on the amorphous carbon layer is used for forming the contact holes by employing an ArF photolithography process.

As described above, in accordance with the first to the tenth embodiments of the present invention, being different from the convention approach of employing the sacrificial hard mask, the amorphous carbon layer is employed as the sacrificial hard mask, and a stack structure including a tungsten layer, a nitride or oxide layer and/or a polysiliocn layer is also used as the sacrificial hard mask in addition to the amorphous carbon layer. As a result, the pattern deformation phenomenon commonly caused by low etch selectivity of the photoresist does not occur during the $F_2$ or ArF photolithography process. Accordingly, it is possible to improve yields of semiconductor devices.

The present application contains subject matter related to the Korean patent application No. KR 2004-59535, filed in the Korean Patent Office on Jul. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming an amorphous carbon layer on an etch target layer;
   forming a photoresist pattern on the amorphous carbon layer;
   etching the amorphous carbon layer by using the photoresist pattern to form a sacrificial hard mask; and
   etching the etch target layer by using the sacrificial hard mask to form a predetermined pattern;
   wherein the photoresist pattern is formed by employing one of ArF photolithography and $F_2$ photolithography.

2. The method of claim 1, wherein the predetermined pattern includes one of a positive pattern and a negative pattern.

3. The method of claim 1, wherein if the etch target layer is an insulation layer, the predetermined pattern includes a contact hole pattern.

4. The method of claim 1, wherein if the etch target layer is a conductive layer, the predetermined pattern includes one of a bit line, a word line and a metal line.

5. A method for fabricating a semiconductor device, comprising the steps of:
   forming an amorphous carbon layer on an etch target layer;
   forming a sacrificial hard mask layer on the amorphous carbon layer;
   forming a photoresist pattern on the sacrificial hard mask layer;

etching the sacrificial hard mask layer by using the photoresist pattern to forming a first sacrificial hard mask;

etching the amorphous carbon layer by using the first sacrificial hard mask to form a second sacrificial hard mask; and etching the etch target layer by using the second sacrificial hard mask to form a predetermined pattern;

wherein the photoresist pattern is formed by employing one of ArF photolithography and $F_2$ photolithopraphy.

6. The method of claim 5, wherein the predetermined pattern includes one of a positive pattern and a negative pattern.

7. The method of claim 5, wherein if the etch target layer is an insulation layer, the predetermined pattern includes a contact hole pattern.

8. The method of claim 5, wherein if the etch target layer is a conductive layer, the predetermined pattern includes one of a bit line, a word line and a metal line.

9. The method of claim 5, wherein the sacrificial hard mask layer includes a material selected from a group consisting of polysilicon, Al, W, $WSi_x$, where x representing an atomic ratio ranging from approximately 1 to approximately 2, WN, Ti, TiN, $TiSi_x$, where x representing an atomic ratio ranging from approximately 1 to approximately 2, TiAlN, TiSiN, Pt, Ir, $IrO_2$, Ru, $RuO_2$, Ag, Au, Co, TaN, CrN, CoN, MoN, $MoSi_x$, where x representing an atomic ratio ranging from approximately 1 to approximately 2, $Al_2O_3$, AlN, $PtSi_x$, where x representing an atomic ratio ranging from approximately 1 to approximately 2 and $CrSi_x$, where x representing an atomic ratio ranging from approximately 1 to approximately 2.

10. A method for fabricating a semiconductor device, comprising the steps of:
    forming an amorphous carbon layer on an etch target layer;
    forming an anti-reflective coating layer on the amorphous carbon layer;
    forming a photoresist pattern on the anti-reflective coating layer;
    etching the anti-reflective coating layer by using the photoresist pattern;
    etching the amorphous carbon layer by using the photoresist pattern to form a sacrificial hard mask; and
    etching the etch target layer by using the sacrificial hard mask to form a predetermined pattern;
    wherein the photoresist pattern is formed by employing one of ArF photolithography and $F_2$ photolithography.

11. The method of claim 10, wherein the predetermined pattern includes one of a positive pattern and a negative pattern.

12. The method of claim 10, wherein if the etch target layer is an insulation layer, the predetermined pattern includes a contact hole pattern.

13. The method of claim 10, wherein if the etch target layer is a conductive layer, the predetermined pattern includes a bit line, a word line and a metal line.

14. The method of claim 10, wherein the anti-reflective coating layer includes one of an organic material and an inorganic material.

15. A method for fabricating a semiconductor device, comprising the steps of:
    forming an amorphous carbon layer on an etch target layer;
    forming a sacrificial hard mask layer on the amorphous carbon layer;
    forming an anti-reflective coating layer on the sacrificial hard mask layer;
    forming a photoresist pattern on the anti-reflective coating layer;
    etching the anti-reflective coating layer by using the photoresist pattern;
    etching the sacrificial hard mask layer by using the photoresist pattern to form a first sacrificial hard mask;
    etching the amorphous carbon layer by using the first sacrificial hard mask to form a second sacrificial hard mask; and
    etching the etch target layer by using the second sacrificial hard mask to form a predetermined pattern;
    wherein the photoresist pattern is formed by employing one of ArF photolithography and $F_2$ photolithography.

16. The method of claim 15, wherein the predetermined pattern includes one of a positive pattern and a negative pattern.

17. The method of claim 15, wherein if the etch target layer is an insulation layer and the predetermined pattern includes a contact hole pattern.

18. The method of claim 15, wherein if the etch target layer is a conductive layer and the predetermined pattern includes a bit line, a word line and a metal line.

19. The method of claim 15, wherein the anti-reflective coating layer includes one of an organic material and an inorganic material.

20. The method of claim 15, wherein the sacrificial hard mask layer includes a material selected from a group consisting of polysilicon, Al, W, $WSi_x$, where x representing an atomic ratio ranging from approximately 1 to approximately 2, WN, Ti, TiN, $TiSi_x$, where x representing an atomic ratio ranging from approximately 1 to approximately 2, TiAlN, TiSiN, Pt, Ir, $IrO_2$, Ru, $RuO_2$, Ag, Au, Co, TaN, CrN, CoN, MoN, $MoSi_x$, where x representing an atomic ratio ranging from approximately 1 to approximately 2, $Al_2O_3$, AlN, $PtSi_x$, where x representing an atomic ratio ranging from approximately 1 to approximately 2 and $CrSi_x$, where x representing an atomic ratio ranging from approximately 1 to approximately 2.

21. A method for fabricating a semiconductor device, comprising the steps of:
    forming an insulation layer on an etch target layer;
    forming an amorphous carbon layer on the insulation layer;
    forming an anti-reflective coating layer on the amorphous carbon layer;
    forming a photoresist pattern on the anti-reflective coating layer;
    etching anti-reflective coating layer by using the photoresist pattern;
    etching the amorphous carbon layer by using the photoresist pattern to form a sacrificial hard mask;
    etching the insulation layer by using the sacrificial hard mask to form a hard mask; and
    etching the etch target layer by using the sacrificial hard mask and the hard mask to form a predetermined pattern;
    wherein the photoresist pattern is formed by employing one of ArF photolithography and $F_2$ photolithography.

22. A method for fabricating a semiconductor device, comprising the steps of:
    forming an insulation layer on an etch target layer;
    forming an amorphous carbon layer on the insulation layer;
    forming a sacrificial hard mask layer on the amorphous carbon layer
    forming an anti-reflective coating layer on the sacrificial hard mask layer;
    forming a photoresist pattern on the anti-reflective coating layer;
    etching anti-reflective coating layer by using the photoresist pattern;
    etching the sacrificial hard mask layer by using the photoresist pattern to form a first sacrificial hard mask;

etching the amorphous carbon layer by using the first sacrificial hard mask to form a second sacrificial hard mask;

etching the insulation layer by using the second sacrificial hard mask to form a hard mask; and etching the etch target layer by using the second sacrificial hard mask and the hard mask to form a predetermined pattern;

wherein the photoresist pattern is formed by employing one of ArF photolithography and $F_2$ photolithography.

23. The method of claim 22, wherein the sacrificial hard mask layer includes a material selected from a group consisting of polysilicon, Al, W, $WSi_x$, where x representing an atomic ratio ranging from approximately 1 to approximately 2, WN, Ti, TiN, $TiSi_x$, where x representing an atomic ratio ranging from approximately 1 to approximately 2, TiAlN, TiSiN, Pt, Ir, $IrO_2$, Ru, $RuO_2$, Ag, Au, Co, TaN, CrN, CoN, MoN, $MoSi_x$, where x representing an atomic ratio ranging from approximately 1 to approximately 2, $Al_2O_3$, AlN, $PtSi_x$, where x representing an atomic ratio ranging from approximately 1 to approximately 2 and $CrSi_x$, where x representing an atomic ratio ranging from approximately 1 to approximately 2.

* * * * *